(12) United States Patent
Chen et al.

(10) Patent No.: US 11,749,950 B2
(45) Date of Patent: Sep. 5, 2023

(54) SHIELDING HOUSING STRUCTURE OF ELECTRIC CONNECTOR WITH FEATURES FOR HEAT VENTILATION AND ELECTROMAGNETIC SHIELDING

(71) Applicant: ACES ELECTRONICS CO., LTD., Taoyuan (TW)

(72) Inventors: Chun-Yuan Chen, Taoyuan (TW); Jen-Sheuan Huang, Taoyuan (TW)

(73) Assignee: ACES ELECTRONICS CO., LTD., Taoyuan (TW)

( * ) Notice: Subject to any disclaimer, the term of this patent is extended or adjusted under 35 U.S.C. 154(b) by 176 days.

(21) Appl. No.: 17/350,988

(22) Filed: Jun. 17, 2021

(65) Prior Publication Data
US 2022/0407266 A1     Dec. 22, 2022

(51) Int. Cl.
| | |
|---|---|
| *H01R 13/6581* | (2011.01) |
| *H01R 13/64* | (2006.01) |
| *H01R 13/50* | (2006.01) |
| *H01R 12/73* | (2011.01) |
| *H05K 1/02* | (2006.01) |
| *H01R 12/57* | (2011.01) |
| *H01R 13/658* | (2011.01) |
| *H01R 12/71* | (2011.01) |
| *H05K 7/20* | (2006.01) |
| *H05K 9/00* | (2006.01) |
| *H01R 43/20* | (2006.01) |

(52) U.S. Cl.
CPC ......... *H01R 13/6581* (2013.01); *H01R 12/73* (2013.01); *H01R 13/50* (2013.01); *H01R 13/64* (2013.01); *H05K 1/0201* (2013.01); *H01R 12/57* (2013.01); *H01R 12/71* (2013.01); *H01R 12/716* (2013.01); *H01R 13/658* (2013.01); *H01R 43/205* (2013.01); *H05K 1/0203* (2013.01); *H05K 7/20* (2013.01); *H05K 9/00* (2013.01)

(58) Field of Classification Search
CPC .... H01R 13/6581; H01R 12/73; H01R 13/50; H01R 13/64; H01R 12/57; H01R 12/71; H01R 13/658; H01R 43/205; H01R 12/716; H05K 1/0201; H05K 1/0203; H05K 7/20; H05K 9/00
See application file for complete search history.

(56) References Cited

FOREIGN PATENT DOCUMENTS

| | | | |
|---|---|---|---|
| CN | 2831506 Y | * 8/2005 | |
| CN | 102576954 A | * 7/2012 | ........... H01R 12/721 |

* cited by examiner

*Primary Examiner* — Abdullah A Riyami
*Assistant Examiner* — Justin M Kratt
(74) *Attorney, Agent, or Firm* — Muncy, Geissler, Olds & Lowe, P.C.

(57) ABSTRACT

A shielding housing structure of an electric connector includes an insulating body including a first terminal slot for insertion of a first terminal set, a second terminal slot for insertion of a second terminal set, a socket for insertion of a preset board; a shielding housing having an accommodation space assembled with a top side of the insulating body, and top holes and lateral holes formed thereon, and an insertion hole formed on upper edges of the lateral holes; and a movable cover having a top covering plate having top openings, and a side covering plate having lateral openings. The top covering plate is plugged into the insertion hole, and can be slid to a first position to form thermal convection ventilation holes on the shielding housing structure, or the top covering plate can be slid to a second position to form an enclosing status of the shielding housing.

17 Claims, 21 Drawing Sheets

SHIELDING HOUSING STRUCTURE OF ELECTRIC CONNECTOR WITH FEATURES FOR HEAT VENTILATION AND ELECTROMAGNETIC SHIELDING

BACKGROUND OF THE INVENTION

1. Field of the Invention

The present invention relates to a shielding housing structure of an electric connector. More particularly, the present invention relates to a shielding housing structure having a movable cover and a shielding housing, and when the movable cover is slid to a first position to make top openings align and overlap with top holes of the shielding housing and make lateral openings align and overlap with lateral holes of the shielding housing, thermal convection ventilation holes are formed for surface-mount technology process; when the movable cover is slid to a second position to make the top openings be blocked by a top plate of the shielding housing and make the lateral openings be blocked by a side plate of the shielding housing, an enclosing status of the shielding housing for shielding electromagnetic wave is formed.

2. Description of the Related Art

M.2, which is also known as next generation form factor (NGFF), is currently standard specification used by solid state drive (SSD) and can support SATA and PCIe interfaces. The M.2 specification has advantages of light, thin, small size, power saving and fast transmission speed and can be designed with different sizes of different electronic products, so as to make applications of the solid state drive (SSD) more flexible. Therefore, the current electronic device is often equipped with an M.2 connector for plugging a solid state drive expansion card. Compared with the conventional hard disk drive (HDD), the solid state drive using memory chips has advantages of small size and faster reading/writing speed.

Generally, M.2 connectors on the market can be divided into two types, the first type of M.2 connector has conductive terminals directly disposed inside an insulating body and has no shielding structure (such as metal shielding housing) disposed on an outer side thereof, and the first type of M.2 connector has the advantage of low cost due to its simple structure, but is unable to effectively block the electromagnetic wave (EMI) generated by the conductive terminals during high-speed transmission of electric data, so the first type of M.2 connector cannot be applied to various electronic devices. The second type of M.2 connector includes conductive terminals disposed inside an insulating body, and a metal shielding housing disposed outside an insulating body. The metal shielding shell of this M.2 connector is a fully enclosed type, which is able to effectively isolate the electromagnetic waves generated by the conductive terminals; however, when this type of M.2 connector is to be soldered on a circuit board by surface-mount technology (SMT) during the manufacturing process, the solder is unable to enter junctions between the conductive terminals of the M.2 connector and bonding pads on the circuit board through thermal convection in a tin furnace, and it causes the soldering parts of the conductive terminals to be incompletely tinned, and further causes the problem of empty soldering or poor soldering, and this problem reduces a production yield rate of electronic products and also increases quality control inspection time and production costs. Therefore, the aforementioned problem is a key issue to be solved in this industry.

SUMMARY OF THE INVENTION

In order to solve the conventional technical problem, inventors develop a shielding housing structure of an electric connector according to collected related data, evaluation and multiple tests.

An objective of the present invention is to provide a shielding housing structure of an electric connector, and the shielding housing structure includes an insulating body, a shielding housing, and a movable cover. The insulating body includes a first terminal slot configured for insertion of a first terminal set formed by a plurality of first conductive terminals, a second terminal slot configured for insertion of a second terminal set formed by a plurality of second conductive terminals, and a socket formed between two opposite inner sides of the first terminal set and the second terminal set and configured for insertion of a preset board. The shielding housing includes a top plate, a side plate, and an accommodation space formed therein and configured to assemble with a top side of the insulating body, wherein the accommodation space has a horizontal opening configured to expose the socket, and the top plate of the shielding housing has a plurality of top holes formed thereon, and the side plate of the shielding housing is away from the horizontal opening and has a plurality of lateral holes formed thereon and an insertion hole formed on upper edges of the plurality of lateral holes. The movable cover includes a top covering plate and a side covering plate perpendicular to each other. The top covering plate has a plurality of top openings formed thereon, and the side covering plate has a plurality of lateral openings formed thereon, the top covering plate are inserted into the insertion hole of the shielding housing and slidable in the insertion hole in a horizontal direction. When the movable cover is slid to a first position to make the plurality of top openings align and overlap with the plurality of top holes of the shielding housing and make the plurality of lateral openings align and overlap with the plurality of lateral holes of the shielding housing, a plurality of thermal convection ventilation holes are formed for surface-mount technology process. When the movable cover is slid to a second position to make the plurality of top openings be blocked by the top plate of the shielding housing and make the plurality of lateral openings be blocked by the side plate of the shielding housing, an enclosing status of the shielding housing for shielding electromagnetic wave is formed.

Another objective of the present invention is that the insulating body includes a guide track disposed on a top surface thereof, and the movable cover includes a sliding slot formed on a side of the plurality of top openings and mounted with the guide track, and a length of the sliding slot is greater than that of the guide track, and the movable cover is slidable on an outer side of the shielding housing in a horizontal direction.

Another objective of the present invention is that the side covering plate of the movable cover has a pushing part disposed on a side thereof and outwardly bent.

Another objective of the present invention is that each of the plurality of first conductive terminals comprises a first joint part upwardly protruded thereon, a first fixing part extended from a side of the first joint part and in a spine shape, and a first solder part downwardly bent from the first fixing part and extended horizontally.

Another objective of the present invention is that each of the plurality of second conductive terminals comprises a second joint part downwardly bent, a second fixing part extended from a side of the second joint part and in a spine shape, and a second solder part downwardly bent from the second fixing part and extended horizontally.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
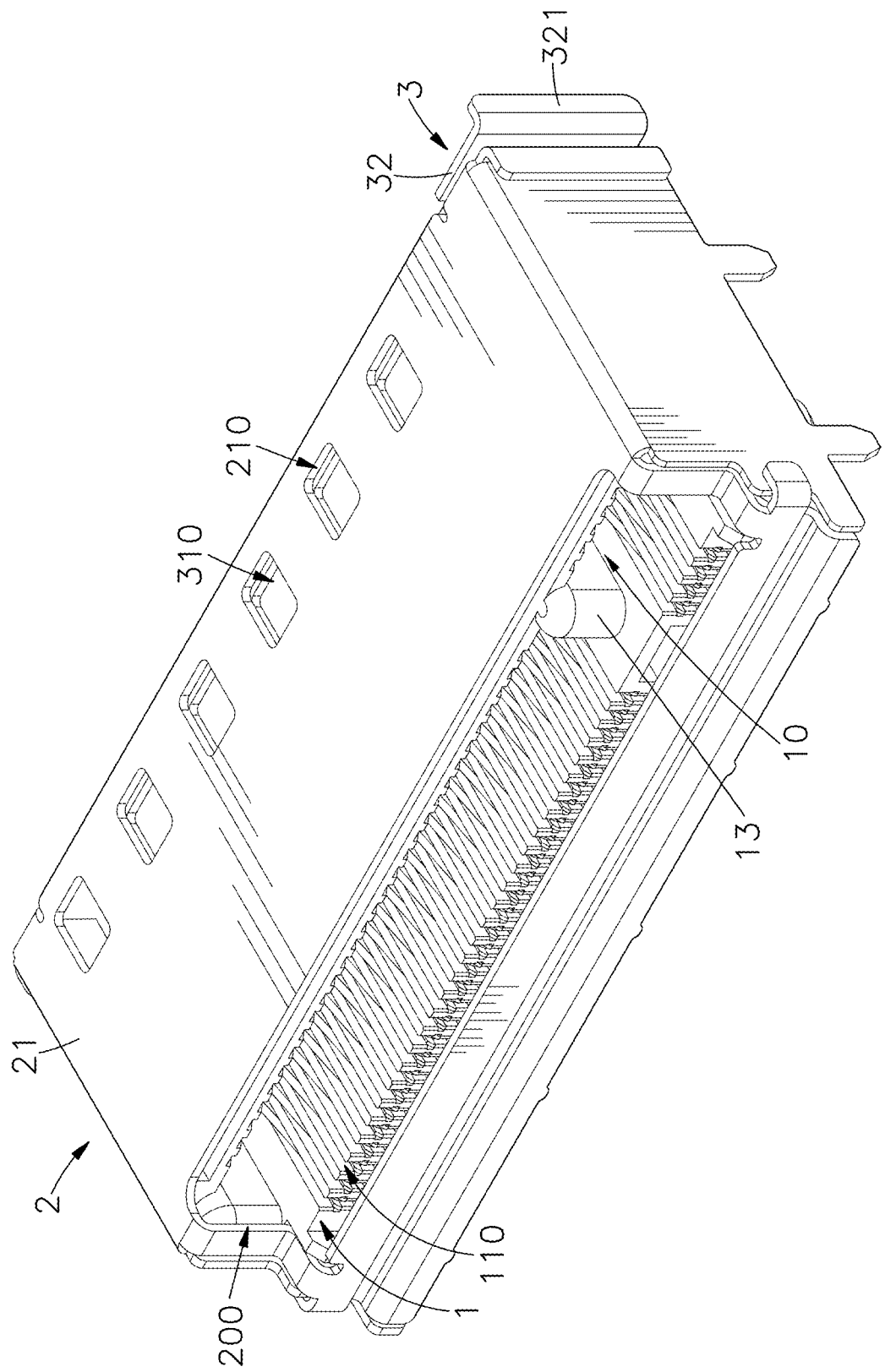
FIG. 1 is a perspective view of a first embodiment of an electric connector of the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include", and variations such as "comprises", "comprising", "includes", or "including", will be acknowledged to imply the inclusion of stated elements but not the exclusion of any other elements.

Figure 2:
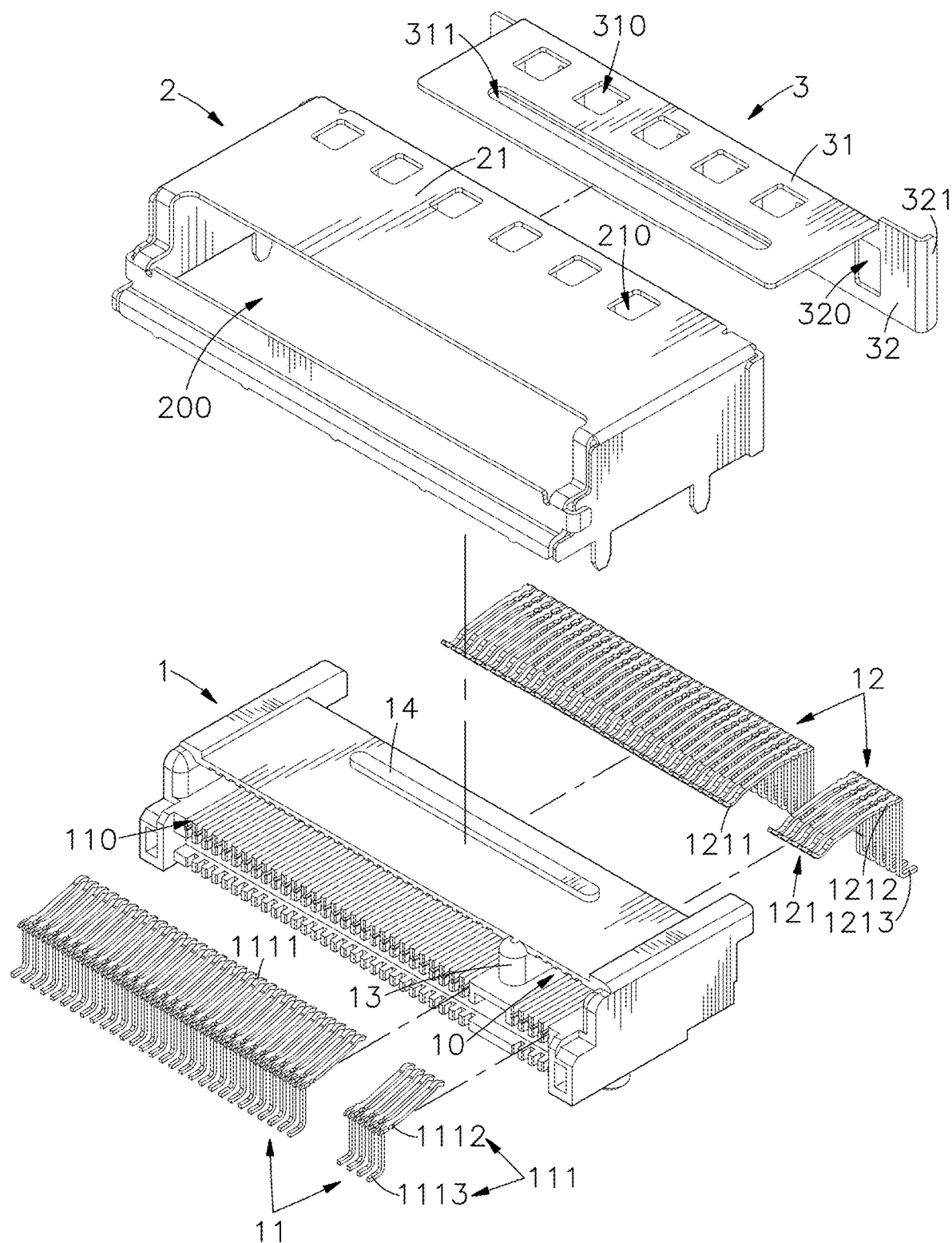
FIG. 2 is a perspective exploded view of a first embodiment of an electric connector of the present invention.
Figure 3:
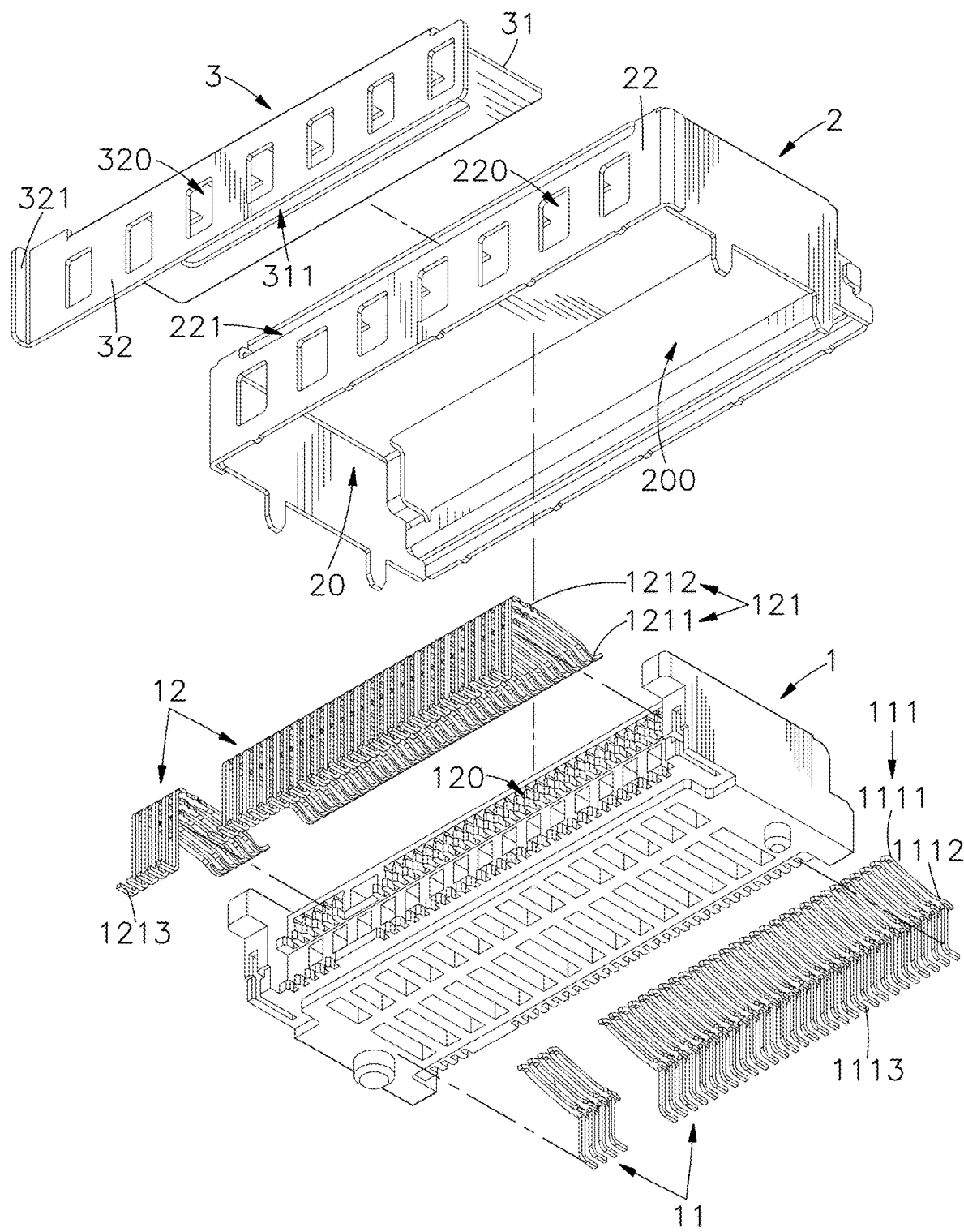
FIG. 3 is another perspective exploded view of a first embodiment of an electric connector of the present invention.
Figure 4:
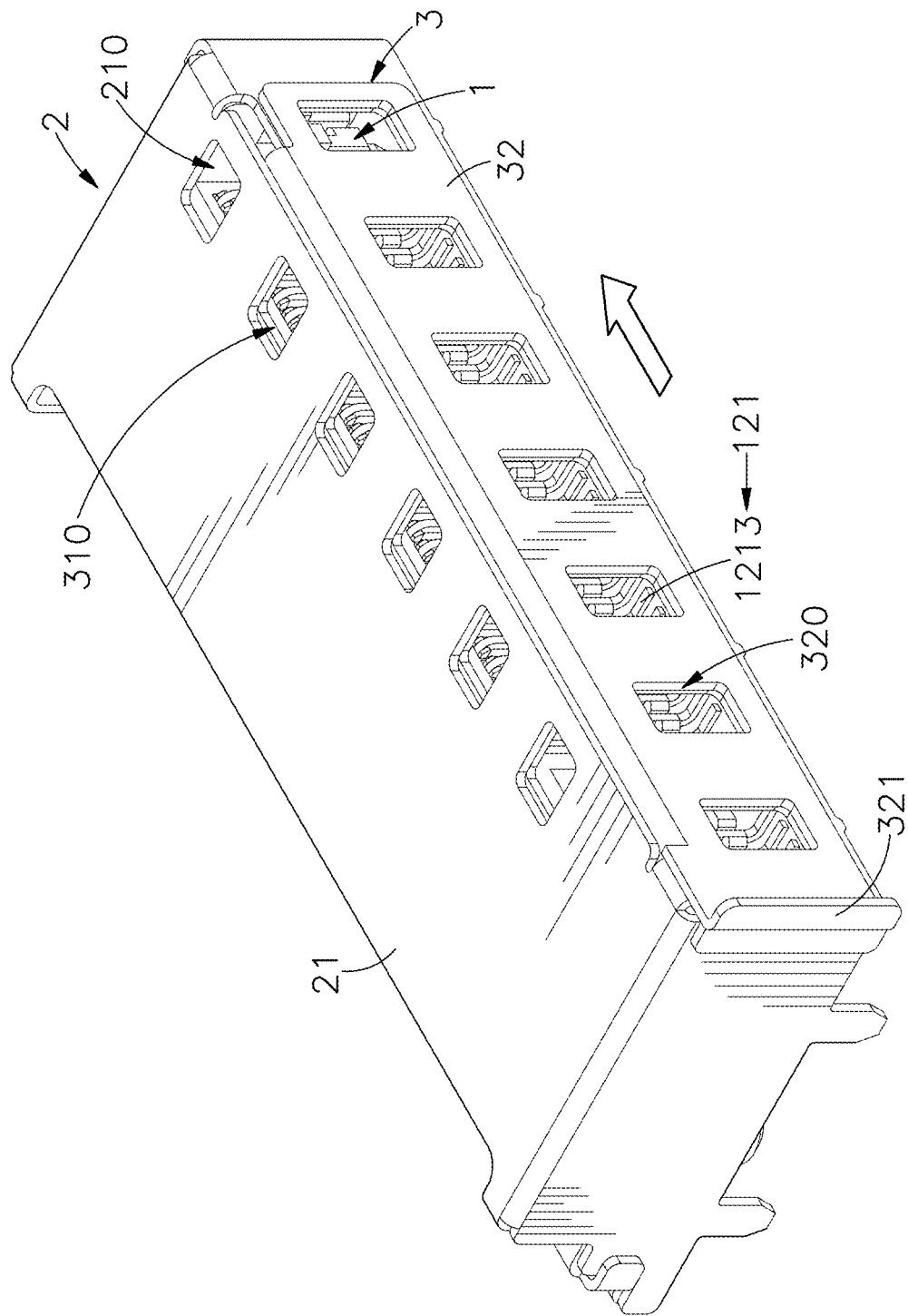
FIG. 4 is a perspective view of a movable cover being slid to a first position, according to the present invention.
Figure 5:
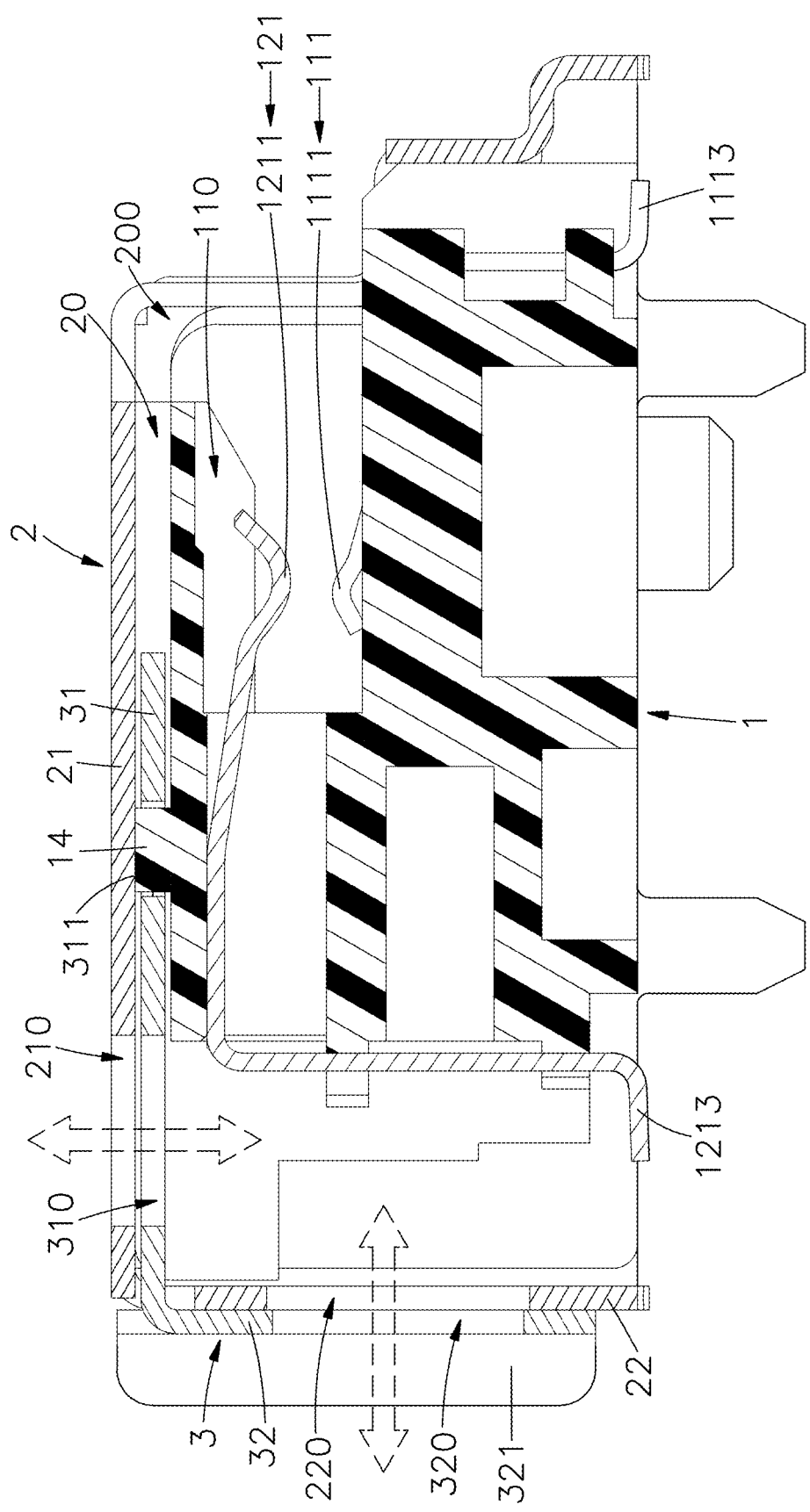
FIG. 5 is a sectional side view of a movable cover being slid to a first position, according to the present invention.
Figure 6:
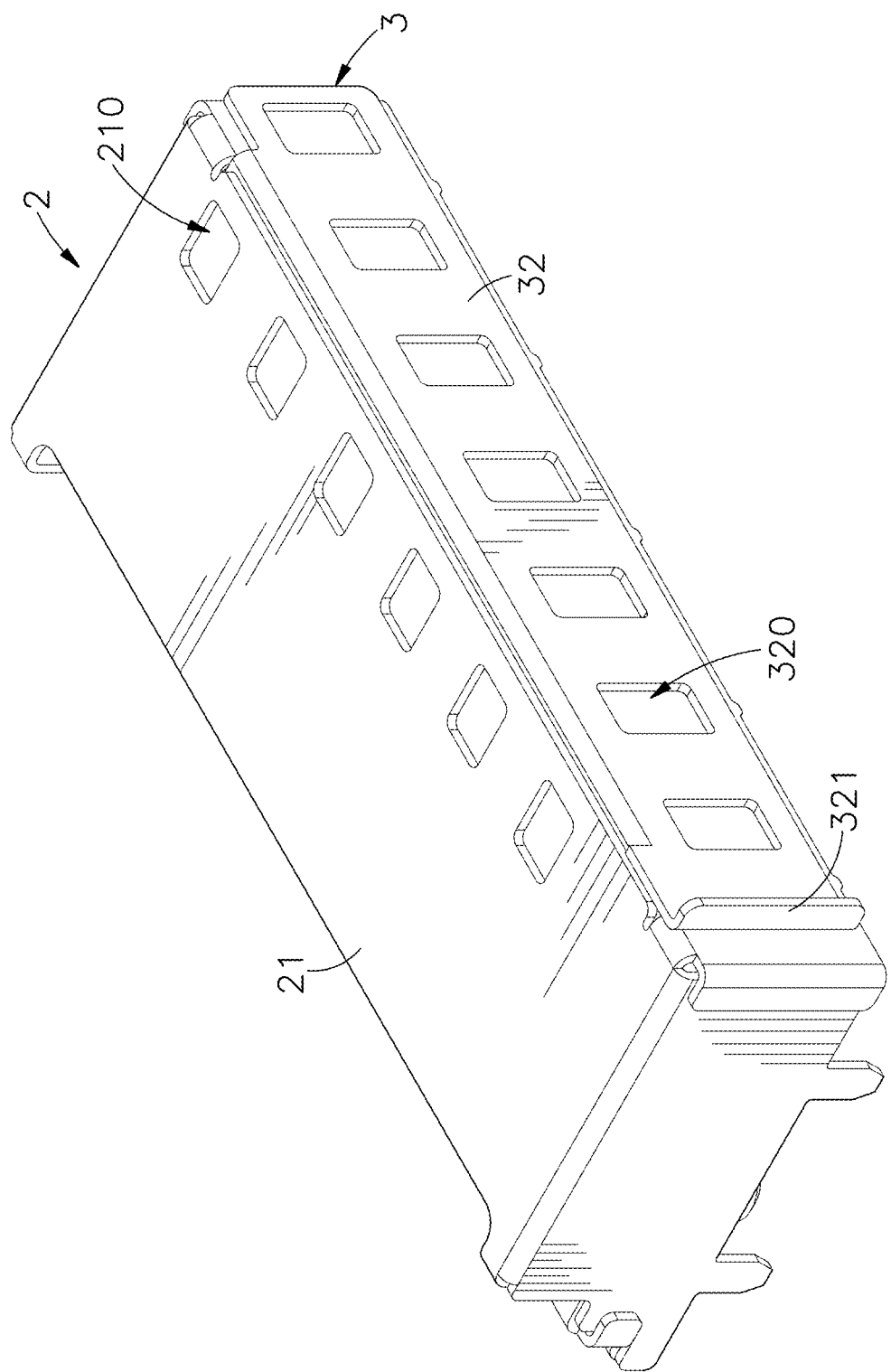
FIG. 6 is a perspective view of a movable cover being slid to a second position, according to the present invention.
Figure 7:
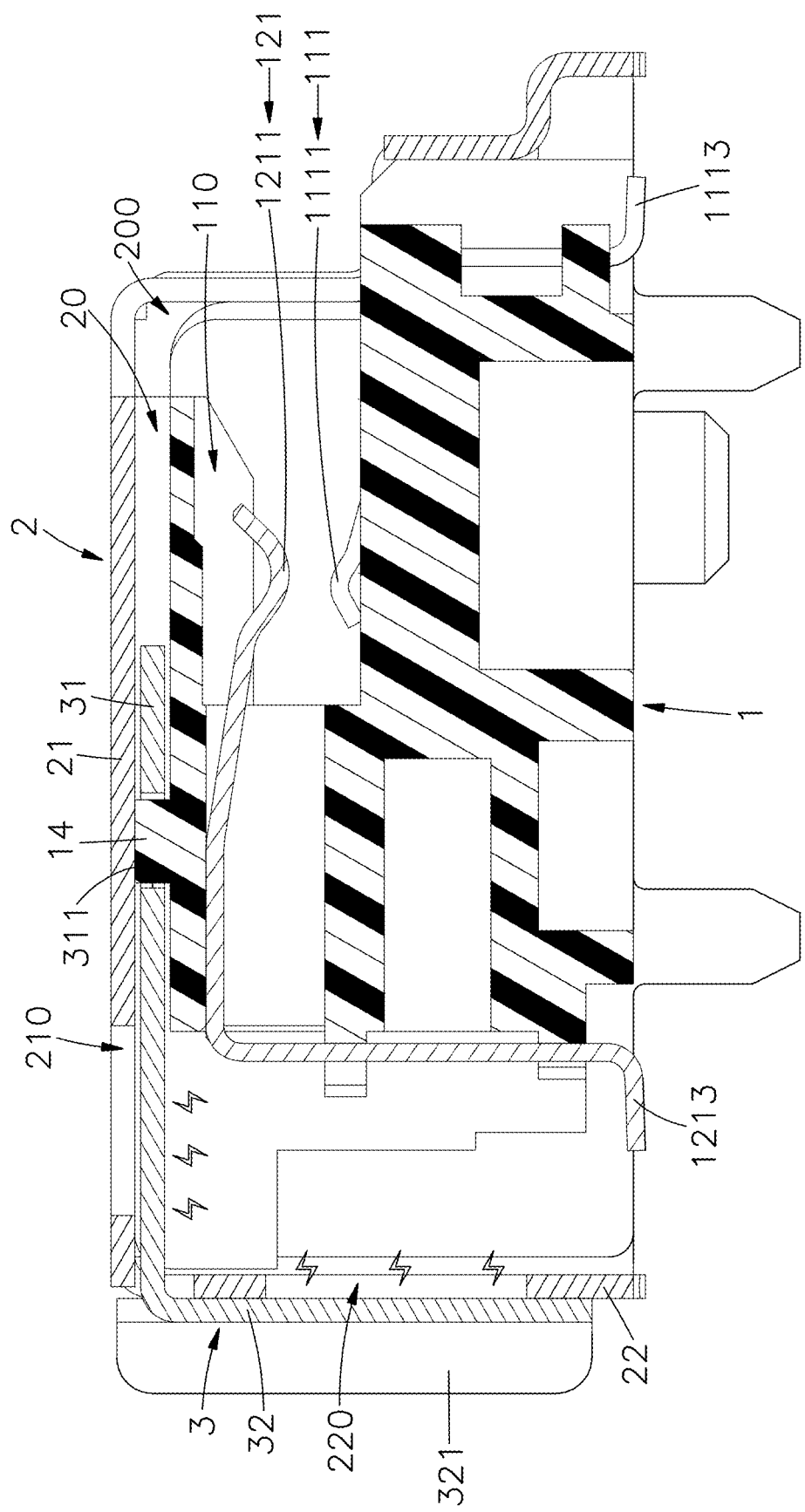
FIG. 7 is a sectional side view of a movable cover being slid to a second position, according to the present invention.

Please refer to FIGS. 1 to 7, which are a perspective view and a perspective exploded view of a first embodiment of an electric connector, another perspective exploded view of a first embodiment of an electric connector, a perspective view and a sectional side view of a movable cover being slid to a first position, and a perspective view and a sectional side view of a movable cover being slid to a second position, according to the present invention. As shown in FIGS. 1 to 7, the electric connector of the present invention includes an insulating body 1, a shielding housing 2 and a movable cover 3. The structures and connection relationship of aforementioned members will be described in detail in the following paragraphs.

The insulating body 1 includes a first terminal slot 110 disposed therein and configured for insertion of a first terminal set 11 formed by a plurality of first conductive terminals 111, a second terminal slot 120 disposed therein and configured for insertion of a second terminal set 12 formed by a plurality of second conductive terminals 121, a socket 10 formed between two opposite inner sides of the first terminal set 11 and the second terminal set 12 and configured for insertion of a preset board (not shown in figures).

The shielding housing 2 has a top plate 21, a side plate 22, an accommodation space 20 formed therein and configured to assemble with a top side of the insulating body 1. The accommodation space 20 has a horizontal opening 200 configured to expose the socket 10. The top plate 21 has a plurality of top holes 210 formed thereon, and the side plate 22 is away from the horizontal opening 200 and has a plurality of lateral holes 220 formed thereon and an insertion hole 221 formed on upper edges of the plurality of lateral holes 220.

The movable cover 3 includes a top covering plate 31 and a side covering plate 32 perpendicular to each other, the top covering plate 31 has a plurality of top openings 310 formed thereon, and the side covering plate 32 has a plurality of lateral openings 320 formed thereon. The top covering plate 31 is inserted into the insertion hole 221 of the shielding housing 2, and slidable in the insertion hole 221 in a horizontal direction. When the movable cover 3 is slid to a first position to make the plurality of top openings 310 align and overlap with the plurality of top holes 210 of the shielding housing 2 and make the plurality of lateral openings 320 align and overlap with the plurality of lateral holes 220 of the shielding housing 2, a plurality of thermal convection ventilation holes can be formed for surface-mount technology process. When the movable cover 3 is slid to a second position to make the plurality of top openings 310 be blocked by the top plate 21 of the shielding housing 2 and make the plurality of lateral openings 320 be blocked by the side plate 22 of the shielding housing 2, an enclosing status of the shielding housing 2 for shielding electromagnetic wave can be formed.

Preferably, the insulating body 1 can include a guide track 14 disposed on a top surface thereof, and the movable cover 3 can include a sliding slot 311 formed on a side of the plurality of top openings 310 and configured to mount with the guide track 14, and a length of the sliding slot 311 is greater than that of the guide track 14, so that the movable cover 3 is slidable on an outer side of the shielding housing 2 in a horizontal direction.

Preferably, the side covering plate 32 of the movable cover 3 can have a pushing part 321 disposed on a side thereof and outwardly bent.

Each first conductive terminal 111 includes a first joint part 1111 upwardly protruded thereon, a first fixing part 1112 extended from a side of the first joint part 1111 and in a spine shape, and a first solder part 1113 downwardly bent from the first fixing part 1112 and extended horizontally.

Each second conductive terminal 121 includes a second joint part 1211 downwardly bent, a second fixing part 1212 extended from a side of the second joint part 1211 and in a spine shape, and a second solder part 1213 downwardly bent from the second fixing part 1212 and extended horizontally. The preset board is in contact with the first joint parts 1111 of the first conductive terminals 111 and the second joint parts 1211 of the second conductive terminals 121 to form an electric connection.

Preferably, the preset board can be an M.2 memory card, and the insulating body 1 has an anti-mistaking block 13 disposed correspondingly in position to the socket 10 where the M.2 memory card is plugged.

In order to assemble the first embodiment of the electric connector of the present invention, the first terminal set 11 is first inserted in the first terminal slot 110 of the insulating body 1, and the second terminal set 12 is inserted into the second terminal slot 120 of the insulating body 1; next, the shielding housing 2 is assembled with the top side of the insulating body 1 to cover the top side of the insulating body 1, and the top covering plate 31 of the movable cover 3 is inserted into the insertion hole 221 of the shielding housing 2, to mount the sliding slot 311 of the movable cover 3 with the guide track 14 of the insulating body 1. Therefore, during the manufacturing process, when the electric connector is to be soldered on a preset circuit board (not shown in figures) by surface-mount technology (SMT), the movable cover 3 can be slid to the first position to make the plurality of top openings 310 align and overlap with the plurality of top holes 210 of the shielding housing 2 and make the plurality of lateral openings 320 align and overlap with the plurality of lateral holes 220 of the shielding housing 2, so that the plurality of thermal convection ventilation holes can be formed for surface-mount technology process, the solder parts 1113 and 1213 of the first and second conductive terminals 111 and 121 can be well soldered on the preset circuit board; after the soldering operation is completed, the movable cover 3 can be slid to the second position to make the plurality of top openings 310 be blocked by the top plate 21 of the shielding housing 2 and make the plurality of lateral openings 320 be blocked by the side plate 22 of the shielding housing 2, so that the enclosing status of the shielding housing 2 for shielding electromagnetic wave can be formed, thereby completing the assembly of the electric connector and the preset circuit board. When the movable cover 3 of the electric connector is located at the second position, the electromagnetic wave, generated by the plurality of first and second conductive terminals 111 and 121 of the electric connector during high-speed transmission of electronic data, can be effectively prevented from emitting out of the shielding housing 2, and it is beneficial to improve production yield rate of the electronic product equipped with the electric connector, and reduce production time and cost of the electronic product equipped with the electric connector.

Figure 8:
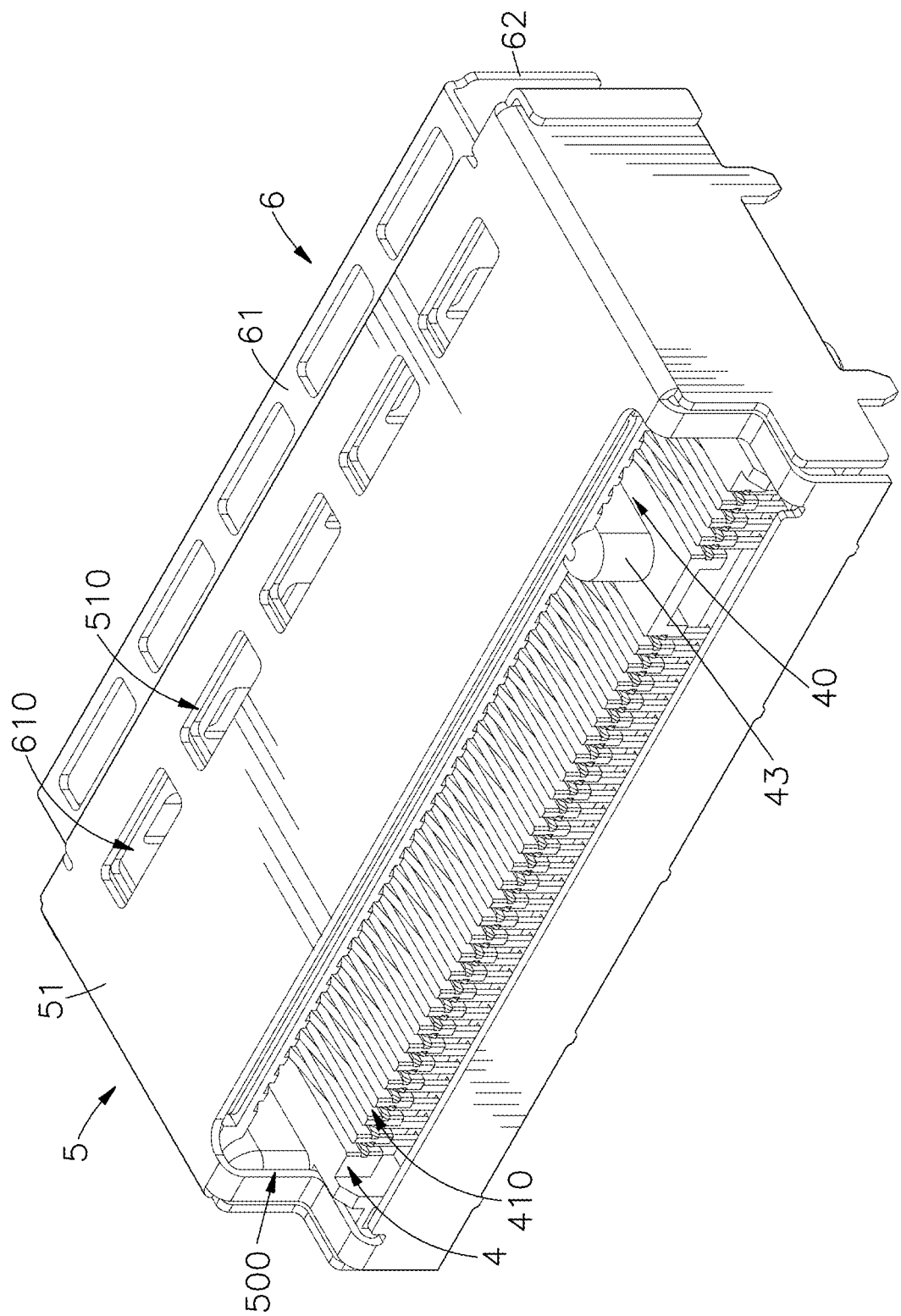
FIG. 8 is a perspective view of a second embodiment of an electric connector of the present invention.
Figure 9:
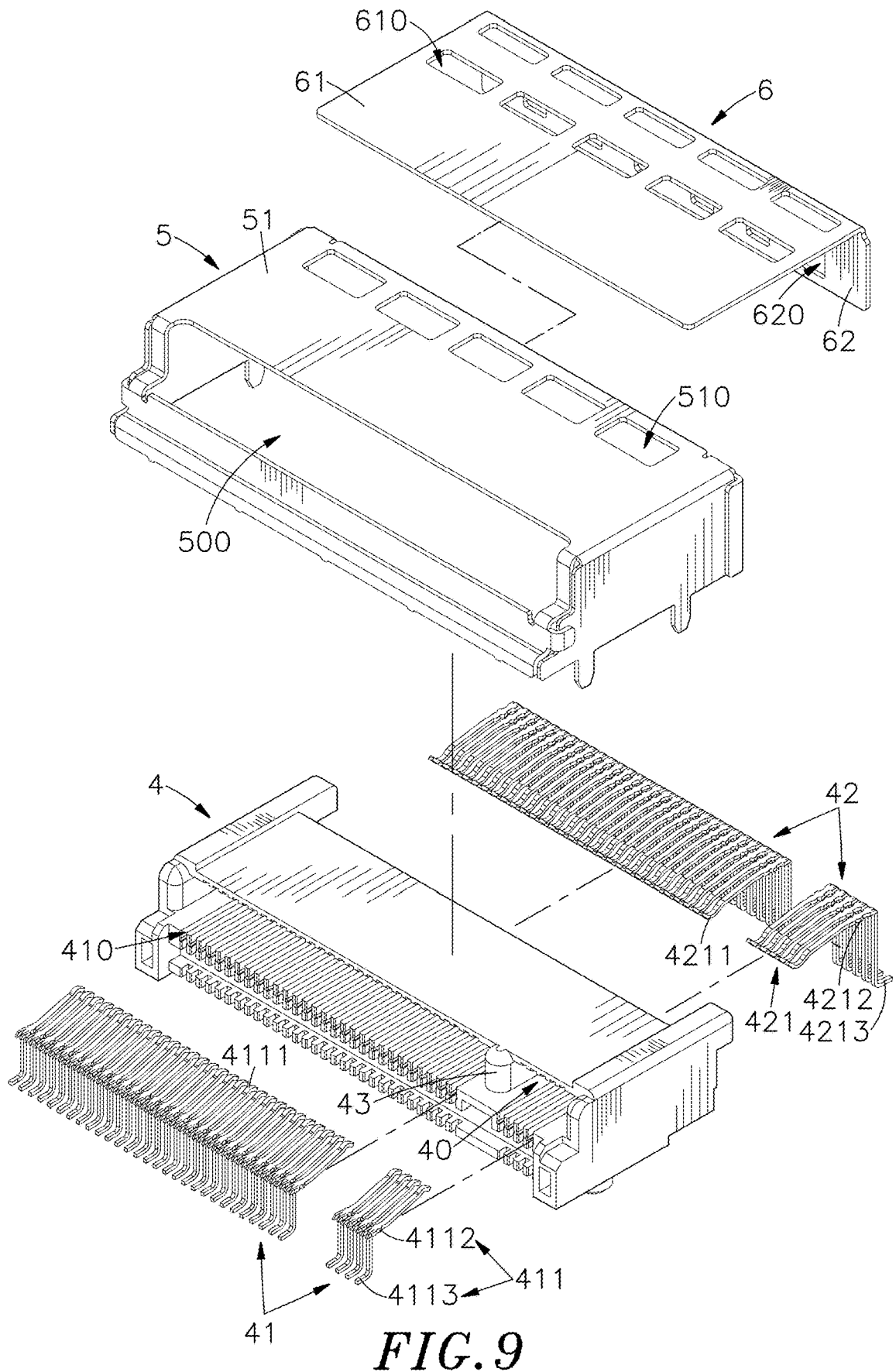
FIG. 9 is a perspective exploded view of a second embodiment of an electric connector of the present invention.
Figure 10:
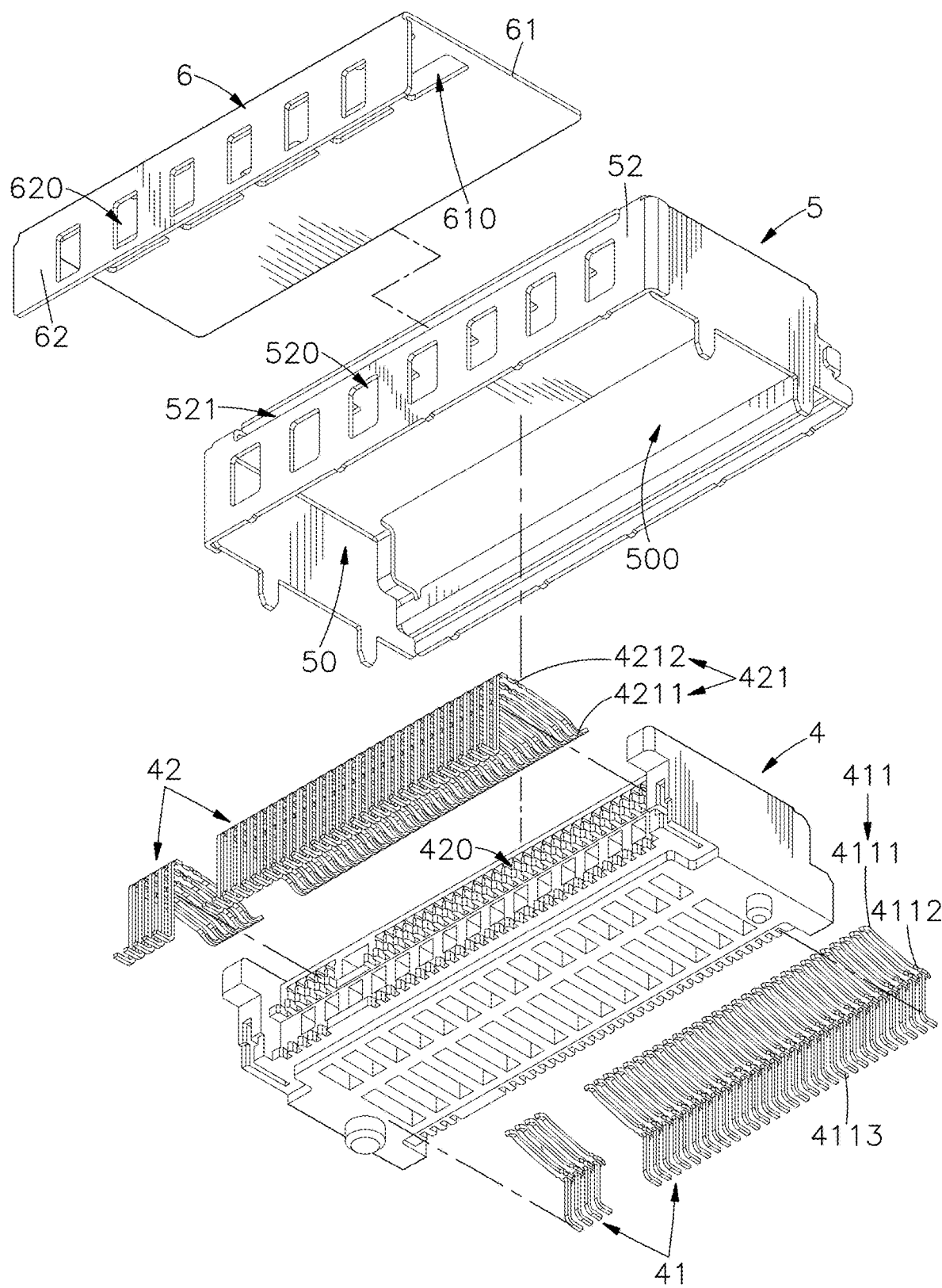
FIG. 10 is another perspective exploded view of a second embodiment of an electric connector of the present invention.
Figure 11:
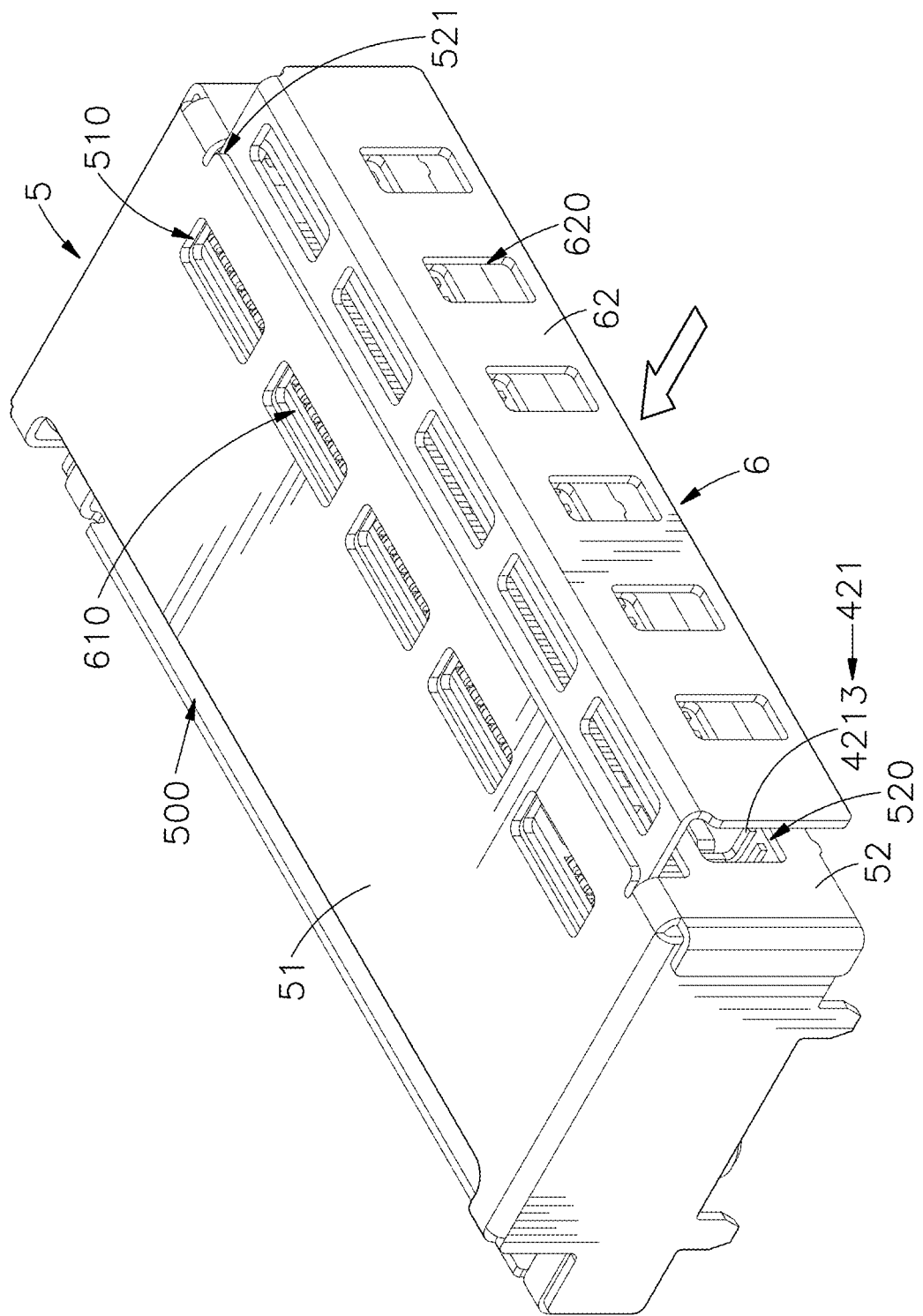
FIG. 11 is a perspective view of a movable cover being half inserted, according to the present invention.
Figure 12:
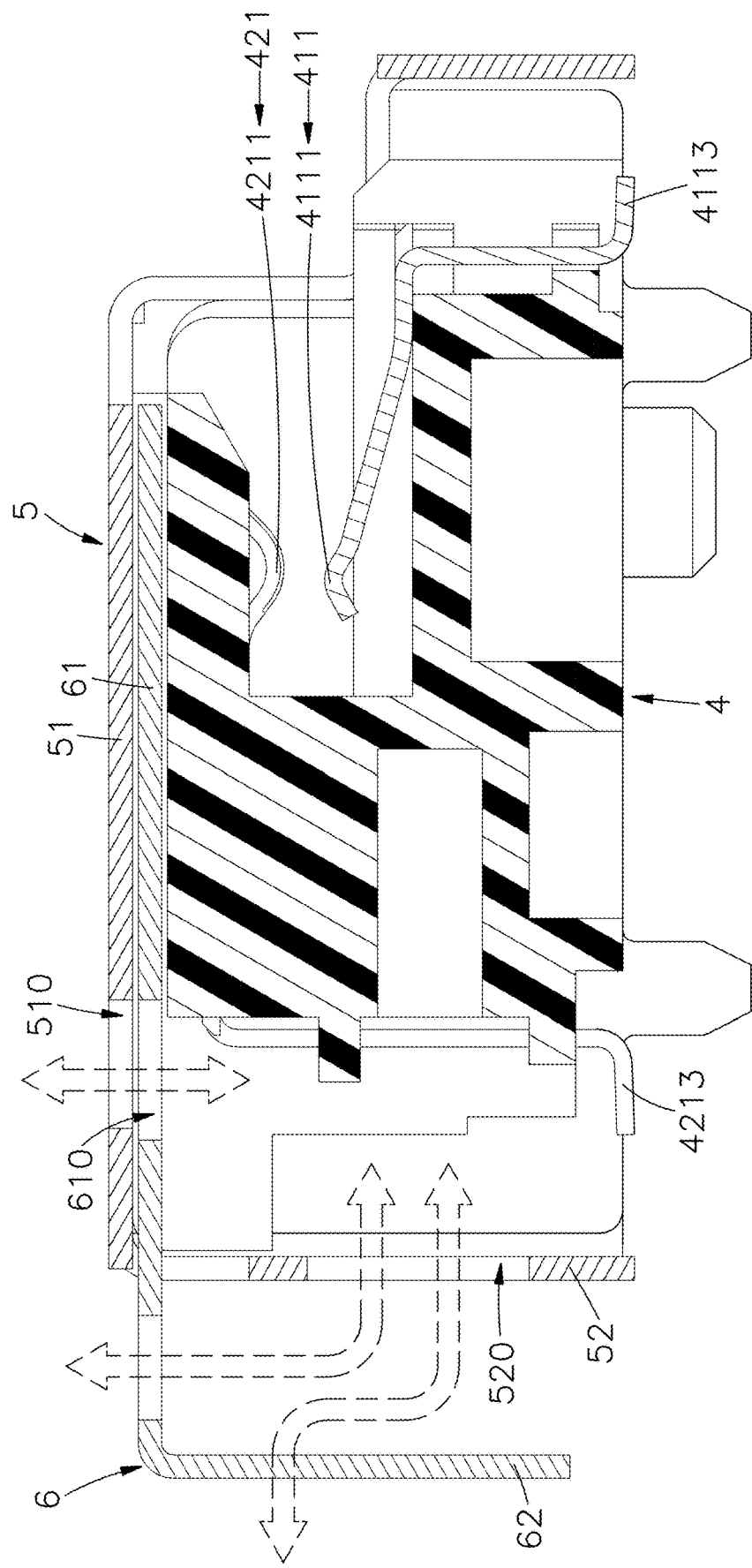
FIG. 12 is a sectional side view of a movable cover being half inserted, according to the present invention.
Figure 13:
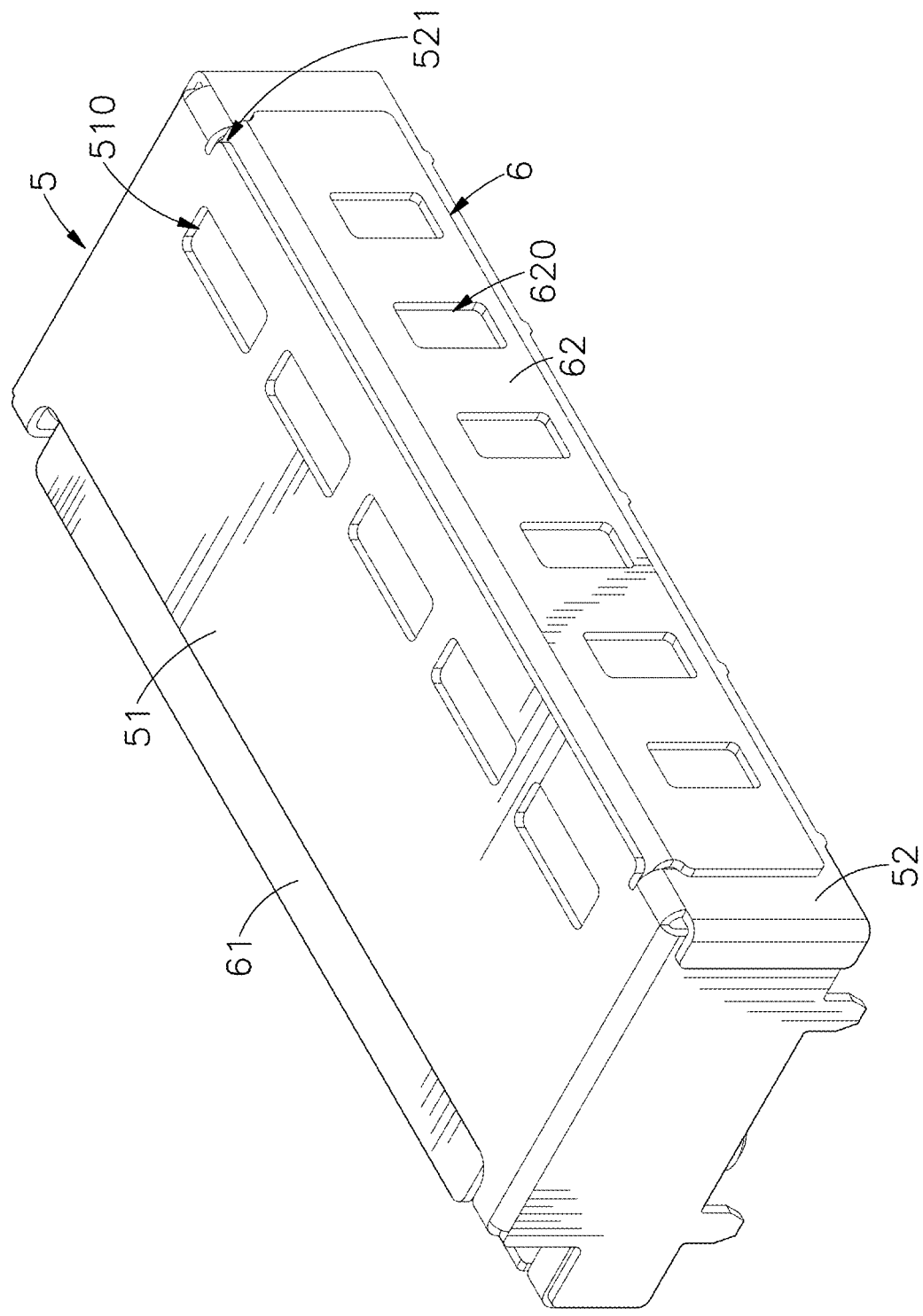
FIG. 13 is a perspective view of a movable cover being fully inserted, according to the present invention.
Figure 14:
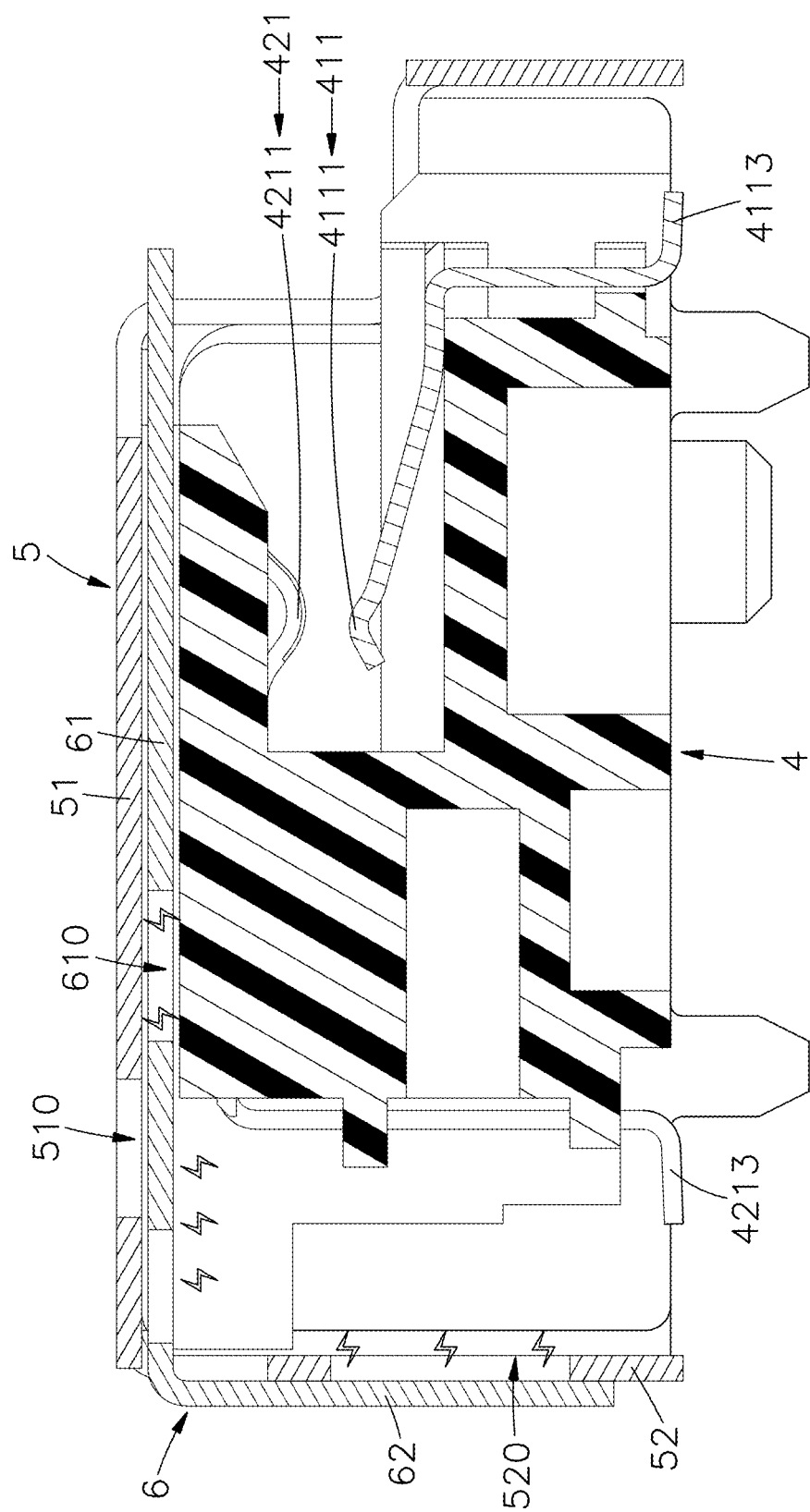
FIG. 14 is a sectional side view of a movable cover being fully inserted, according to the present invention.

Please refer to FIGS. 8 to 14, which are a perspective view and a perspective exploded view of a second embodiment of an electric connector, another perspective exploded view of a second embodiment of an electric connector, a perspective view and a sectional side view of a movable cover being half inserted, and a perspective view and a sectional side view of the movable cover being fully inserted, according to the present invention. As shown in FIGS. 8 to 14, the electric connector of the present invention includes an insulating body 4, a shielding housing 5 and a movable cover 6, and the structures and connection relationship of aforementioned members will be described in detail in the following paragraphs.

The insulating body 4 includes a first terminal slot 410 disposed therein and configured for insertion of a first terminal set 41 formed by a plurality of first conductive terminals 411, a second terminal slot 420 disposed therein and configured for insertion of a second terminal set 42 formed by a plurality of second conductive terminals 421, and a socket 40 formed between the opposite inner sides of the first terminal set 41 and the second terminal set 42 and configured for insertion of a preset board (not shown in figures).

The shielding housing 5 has a top plate 51, a side plate 52, and an accommodation space 50 formed therein and configured to assemble with a top side of the insulating body 4, and having a horizontal opening 500 configured to expose the socket 40. The top plate 51 has a plurality of top holes 510 formed thereon. The side plate 52 is away from the horizontal opening 500, and has a plurality of lateral holes 520 formed thereon and an insertion hole 521 formed on upper edges of the plurality of lateral holes 520.

The movable cover 6 includes a top covering plate 61 and a side covering plate 62 perpendicular to each other, the top covering plate 61 has a plurality of top openings 610 formed thereon, and the side covering plate 62 has a plurality of lateral openings 620 formed thereon. The top covering plate 61 is tightly plugged into the insertion hole 521 of the shielding housing 5, and can be located by being half inserted or fully inserted into the insertion hole 521. When the movable cover 6 is half inserted into the insertion hole 521 to make a part of the plurality of top openings 610 align and overlap with the plurality of top holes 510 of the shielding housing 5 and make the remaining of the plurality of top openings 610 locate outside the shielding housing 5, the plurality of lateral openings 620 are misaligned with the plurality of lateral holes 520, and a plurality of thermal convection ventilation holes are formed for surface-mount technology process. When the movable cover 6 is slid to fully insert into the insertion hole 521 to make the plurality of top openings 610 be blocked by the top plate 51 of the shielding housing 5 and make the plurality of lateral openings 620 be blocked by the side plate 52 of the shielding housing 5, an enclosing status of the shielding housing 5 for shielding electromagnetic wave can be formed.

Each first conductive terminal 411 includes a first joint part 4111 upwardly protruded thereon, a first fixing part 4112 extended from a side of the first joint part 4111 and in a spine shape, and a first solder part 4113 downwardly bent from the first fixing part 4112 and extended horizontally.

Each second conductive terminal 421 includes a second joint part 4211 downwardly bent, a second fixing part 4212 extended from a side of the second joint part 4211 and in a spine shape, and a second solder part 4213 downwardly bent from the second fixing part 4212 and extended horizontally. The preset board can be in contact with the first joint parts 4111 of the first conductive terminals 411 and the second joint parts 4211 of the second conductive terminals 421 to form an electric connection.

Preferably, the preset board can be an M.2 memory card, and the insulating body 4 has an anti-mistaking block 43 disposed correspondingly in position to the socket 40 where the M.2 memory card is plugged.

The assembling operation for the second embodiment of the electric connector of the present invention is the same as that of the first embodiment, so the detailed description is not repeated therein; however, there is a difference in the operation of soldering the electric connector of the second embodiment on the preset circuit board by SMT during the manufacturing process. With configuration of the second embodiment, the movable cover 6 can be half inserted to make a part of the plurality of top openings 610 align and overlap with the plurality of top holes 510 of the shielding housing 5 and make the remaining of the plurality of top openings 610 locate outside the shielding housing 5, the plurality of lateral openings 620 are misaligned with the plurality of lateral holes 520, and the plurality of thermal convection ventilation holes can be formed for SMT process, so that the solder parts 4113 and 4213 of the first and second conductive terminals 411 and 421 can be well soldered on the preset circuit board. After the soldering operation is completed, the movable cover 6 can be slid to fully inserted into the insertion hole 521 to make the plurality of top openings 610 be blocked by the top plate 51 of the shielding housing 5 and make the plurality of lateral openings 620 be blocked by the side plate 52 of the shielding housing 5, so that the enclosing status of the shielding housing 5 for shielding electromagnetic wave can be formed, thereby completing the assembly of the electric connector and the preset circuit board. When the movable cover 6 of the electric connector is located by fully inserted into the insertion hole 521, the electromagnetic wave, generated by the plurality of first and second conductive terminals 411 and 421 of the electric connector during high-speed transmission of electronic data, can be effectively prevented from emitting out of the shielding housing 5, and it is beneficial to improve production yield rate of the electronic product equipped with the electric connector, and reduce production time and cost of the electronic product equipped with the electric connector.

Figure 15:
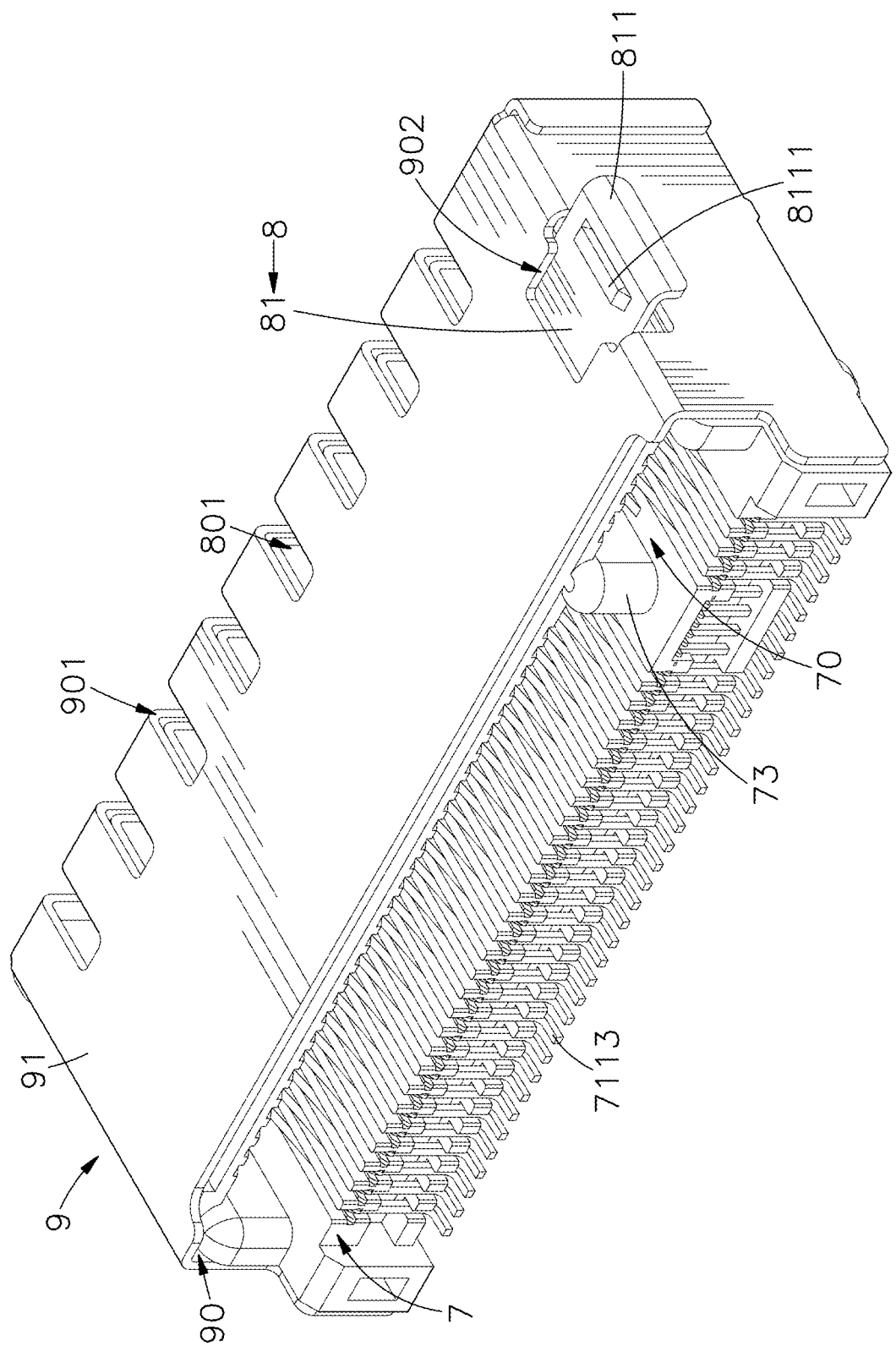
FIG. 15 is a perspective view of a third embodiment of an electric connector of the present invention.
Figure 16:
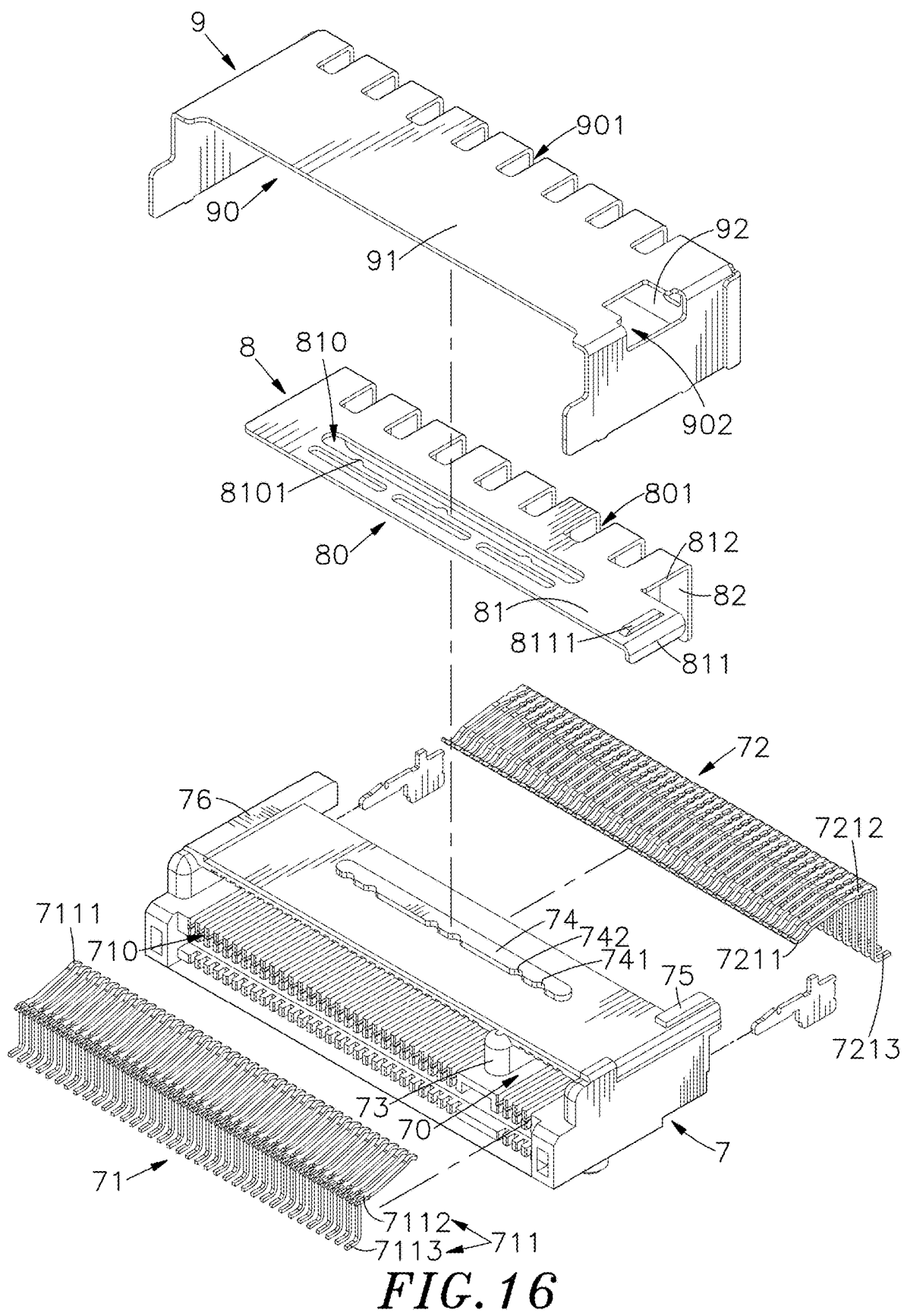
FIG. 16 is a perspective exploded view of a third embodiment of an electric connector of the present invention.
Figure 17:
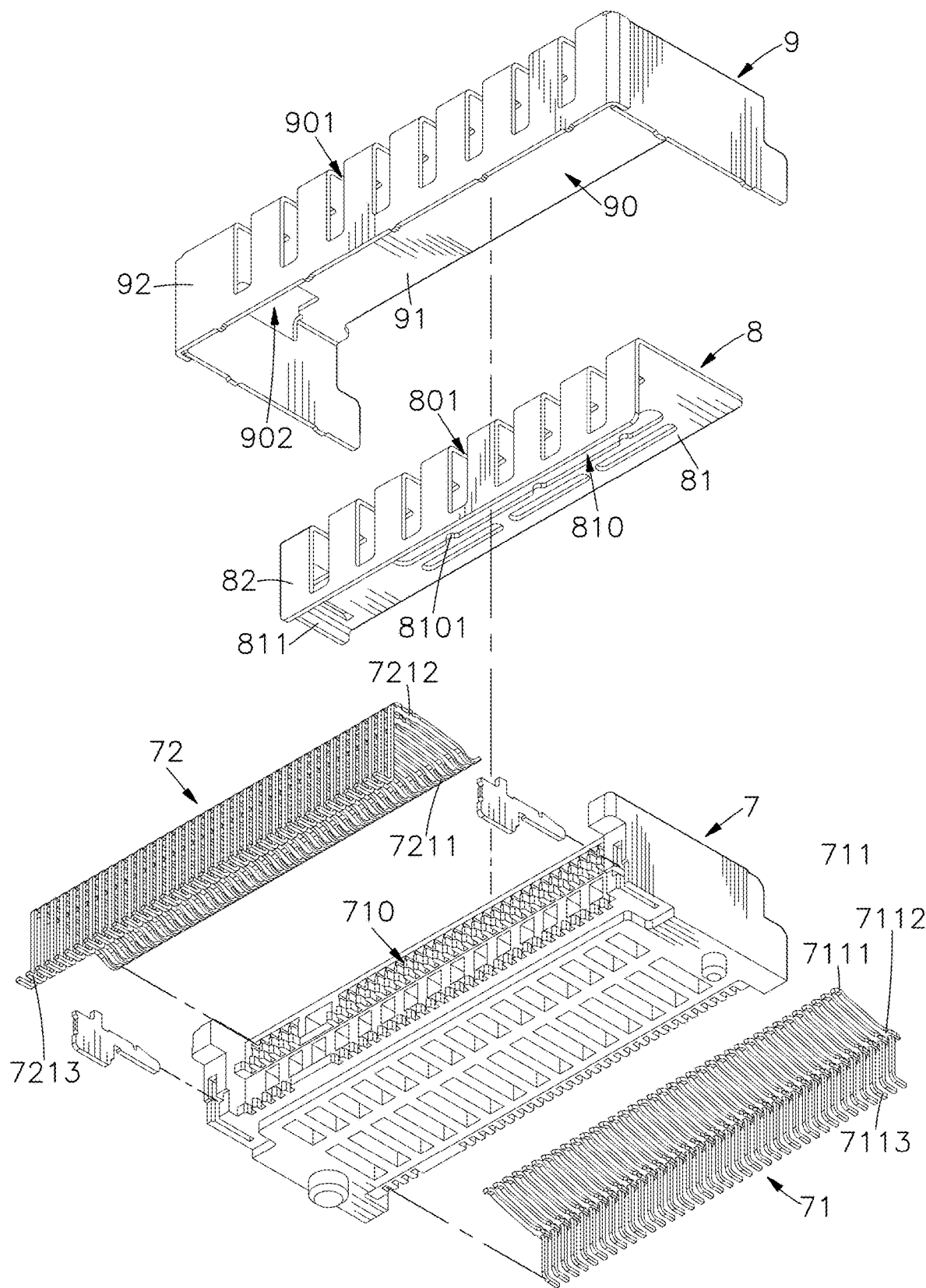
FIG. 17 is another perspective exploded view of a third embodiment of an electric connector of the present invention.
Figure 18:
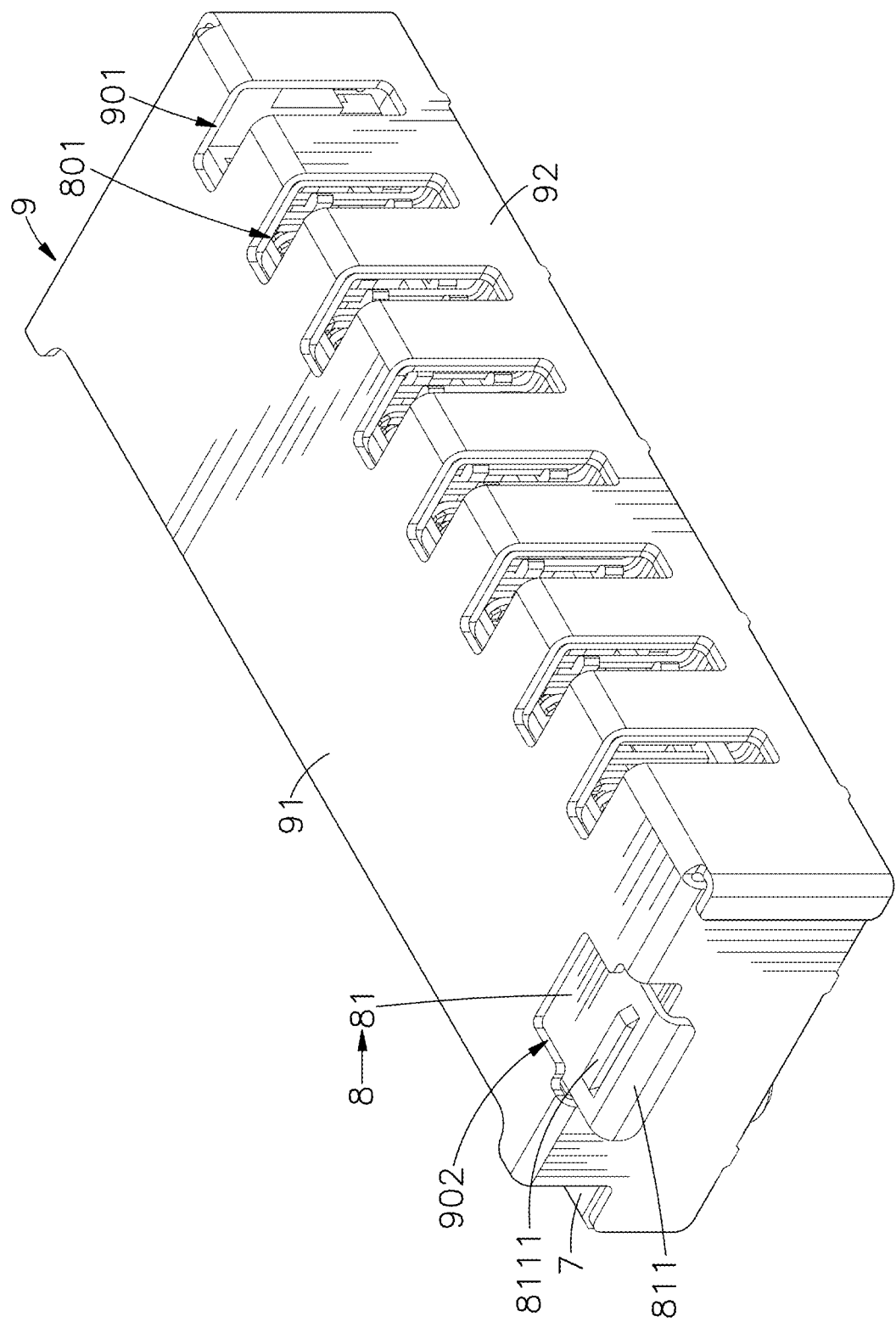
FIG. 18 is a perspective view of a movable cover being slid to a first position under a shielding housing, according to the present invention.
Figure 19:
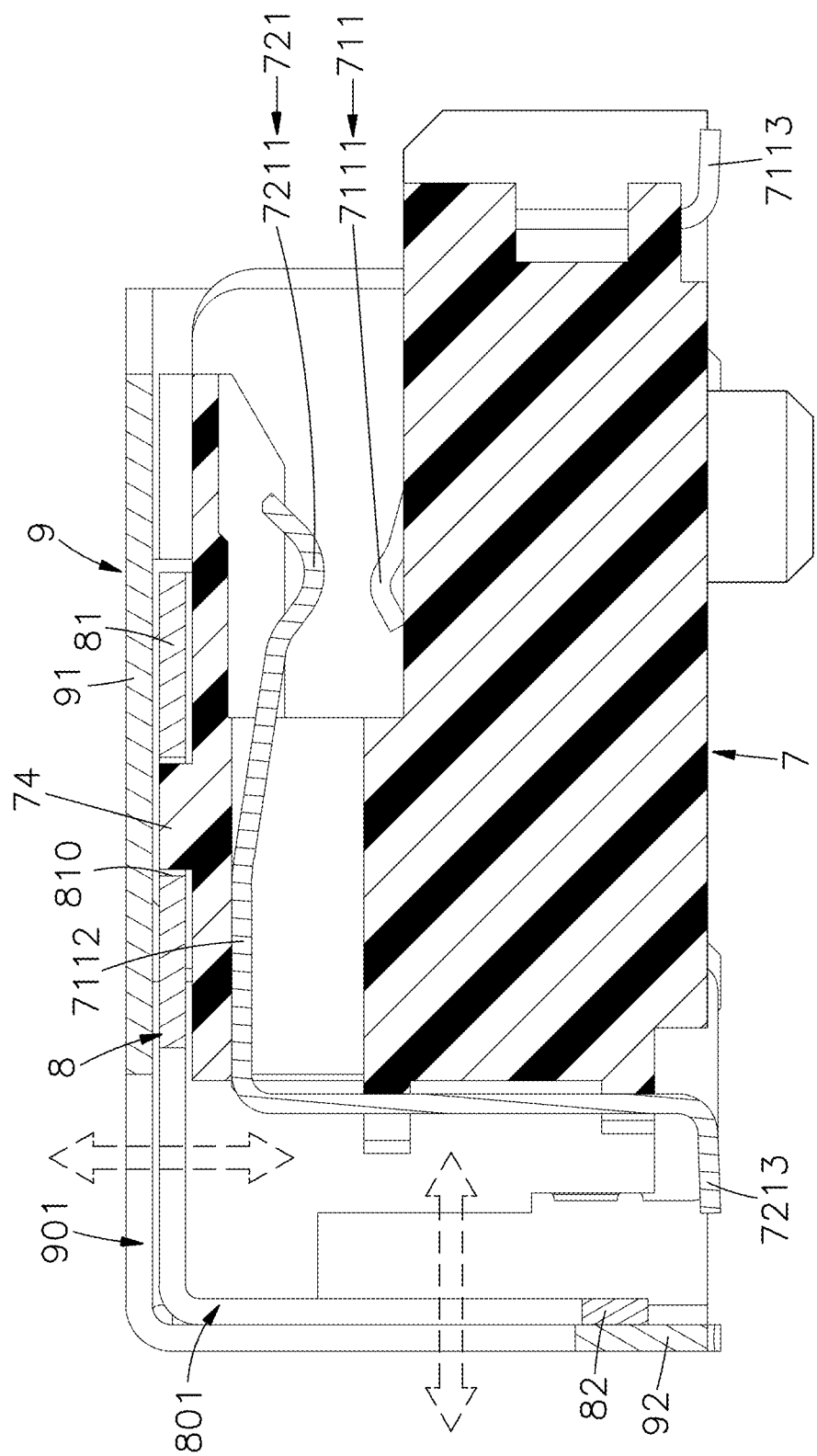
FIG. 19 is a sectional side view of a movable cover being slid to a first position under a shielding housing, according to the present invention.
Figure 20:
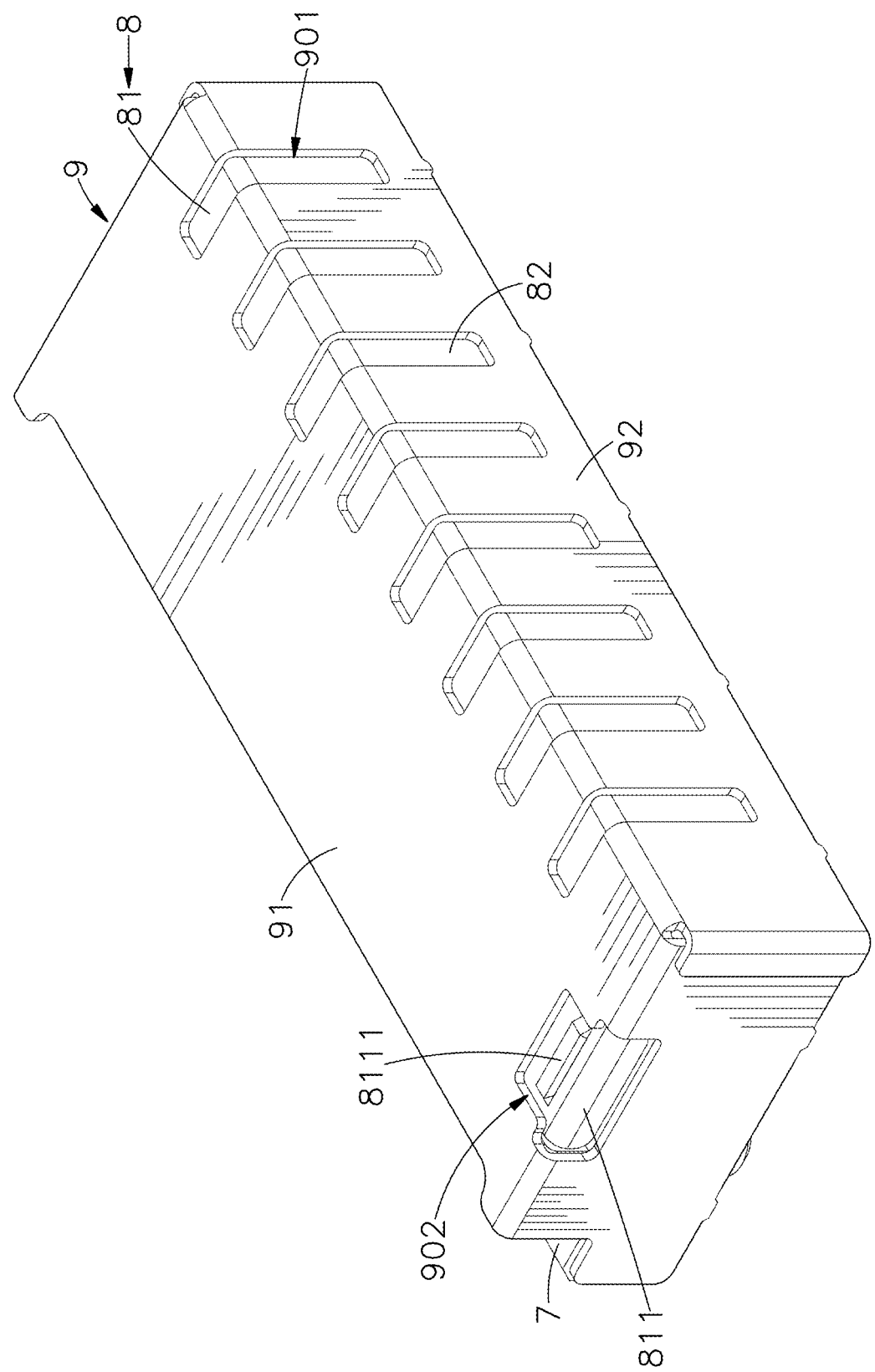
FIG. 20 is a perspective view of a movable cover being slid to a second position under a shielding housing, according to the present invention.
Figure 21:
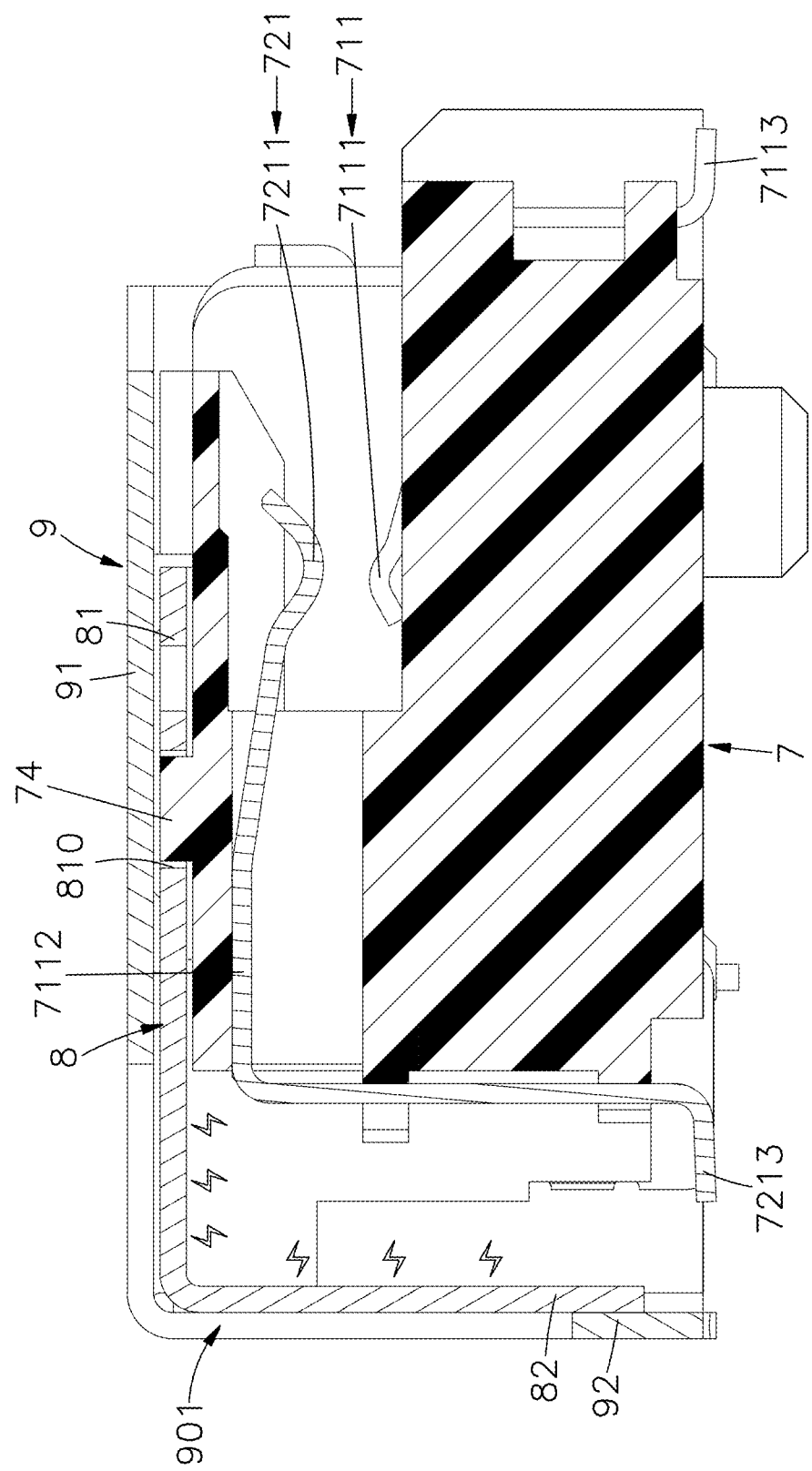
FIG. 21 is a sectional side view of a movable cover being slid to a second position under a shielding housing, according to the present invention.

Please refer to FIGS. 15 to 21, which are a perspective view and a perspective exploded view of a third embodiment of an electric connector, another perspective exploded view of a third embodiment of an electric connector, a perspective view and a sectional side view of a movable cover being slid to a first position under the shielding housing, and a perspective view and a sectional side view of a movable cover being slid to a second position under the shielding housing, according to the present invention. As shown in FIGS. 15 to 21, the electric connector of the present invention includes an insulating body 7, a movable cover 8 and a shielding housing 9, and the structures and connection relationship of aforementioned members will be described in detail in the following paragraphs.

The insulating body 7 includes a first terminal slot 710 disposed therein and configured for insertion of a first terminal set 71 formed by a plurality of first conductive terminals 711, a second terminal slot 720 disposed therein and configured for insertion of a second terminal set 72 formed by a plurality of second conductive terminals 721, a socket 70 formed between the opposite inner sides of the first terminal set 71 and the second terminal set 72 and configured for insertion of a preset board (not shown in figures).

The movable cover 8 includes a top covering plate 81 and a side covering plate 82 perpendicular to each other, and an assembly space 80 clamped between the top covering plate 81 and the side covering plate 82 and configured to assemble with a top side of the insulating body 7, and a plurality of openings 801 formed on a connection part between the top covering plate 81 and the side covering plate 82 and in communication with the assembly space 80. The movable cover 8 is slidable in an outer side of the insulating body 7 in a horizontal direction.

The shielding housing 9 includes a top plate 91 and a side plate 92 perpendicular to each other, and an accommodation space 90 clamped between the top plate 91 and the side plate 92 and configured to assemble with top sides of the insulating body 7 and the movable cover 8, and a plurality of holes 901 formed on a connection part between the top plate 91 and the side plate 92 and in communication with the accommodation space 90. The movable cover 8 is slidable between the insulating body 7 and the shielding housing 9 in a horizontal direction. When the movable cover 8 is slid to a first position to make the plurality of openings 801 align and overlap with the plurality of holes 901 of the shielding housing 9, a plurality of thermal convection ventilation holes can be formed for surface-mount technology process. When the movable cover 8 is slid to a second position to make the top covering plate 81 and the side covering plate 82 block the plurality of holes 901 of the shielding housing 9, an enclosing status of the shielding housing 9 for shielding electromagnetic wave can be formed.

Each first conductive terminal 711 includes a first joint part 7111 upwardly protruded thereon, a first fixing part 7112 extended from a side of the first joint part 7111 and in a spine shape, and a first solder part 7113 downwardly bent from the first fixing part 7112 and extended horizontally.

Each second conductive terminal 721 includes a second joint part 7211 downwardly bent, a second fixing part 7212 extended from a side of the second joint part 7211 and in a spine shape, and a second solder part 7213 downwardly bent from the second fixing part 7212 and extended horizontally.

Preferably, the preset board can be an M.2 memory card, and the insulating body 7 has an anti-mistaking block 73 disposed correspondingly in position to the socket 70 where the M.2 memory card is plugged.

Preferably, the insulating body 7 further has a guide track 74 disposed on a top surface thereof, and the guide track 74 has a plurality of first locating recesses 741 and a plurality of second locating recesses 742 formed on a side thereof, and the movable cover 8 has a sliding slot 810 formed on the top covering plate 81 and configured to mount with the guide track 74. The sliding slot 810 has a plurality of locating blocks 8101 disposed correspondingly in position to the plurality of first locating recesses 741 and the plurality of second locating recesses 742. A length of the sliding slot 810 is greater than that of the guide track 74, so that the movable cover 8 is slidable under the shielding housing 9 in a horizontal direction.

Preferably, the insulating body 7 includes a first stop part 75 and a second stop part 76 disposed on two sides of a top surface thereof, respectively. The first stop part 75 is configured to abut with and locate a first abutting edge 812 on a side of the top covering plate 81 of the movable cover 8, and the second stop part 76 is configured to abut with and locate a second abutting edge 813 on another side of the top covering plate 81 of the movable cover 8.

Preferably, the top covering plate 81 of the movable cover 8 includes a pushing part 811 protruded on a side thereof, and the pushing part 811 includes a pushing block 8111 protruded on a top thereof, and the shielding housing 9 includes an operation hole 902 disposed correspondingly in position to the pushing part 811 and the pushing block 8111.

In order to assemble the third embodiment of the electric connector of the present invention, the first terminal set 71 is inserted in the first terminal slot 710 of the insulating body 7, and the second terminal set 72 is inserted into the second terminal slot 720 of the insulating body 7; the movable cover 8 is then assembled on the top side of the insulating body 7 to cover the top side of the insulating body 7 and mount the sliding slot 810 of the movable cover 8 on an outer side of the guide track 74 of the insulating body 7. When the electric connector is to be soldered on the preset circuit board by SMT during the manufacturing process, the movable cover 8 can be slid to the first position to make the plurality of locating blocks 8101 of the movable cover 8 engage in the first locating recesses 741 of the insulating body 7 and make the plurality of openings 801 align and overlap with the plurality of holes 901 of the shielding housing 9, and a plurality of thermal convection ventilation holes can be formed for surface-mount technology process, so that the solder parts 7113 and 7213 of the first and second conductive terminals 711 and 721 can be well soldered on the preset circuit board. After the soldering operation is completed, the movable cover 8 can be slid to the second position to make the plurality of locating blocks 8101 of the movable cover 8 engage in the second locating recesses 742 of the insulating body 7, so that the top covering plate 81 and the side covering plate 82 block the plurality of holes 901 of the shielding housing 9, and the enclosing status of the shielding housing 9 for shielding electromagnetic wave can be formed, thereby completing the assembly of the electric connector and the preset circuit board. When the movable cover 8 of the electric connector is located at the second position, the electromagnetic wave, generated by the plurality of conductive terminals 711 and 721 of the electric connector during high-speed transmission of electronic data, can be effectively prevented from emitting out of the shielding housing 9, and it is beneficial to improve production yield rate of the electronic product equipped with the electric connector, and reduce production time and cost of the electronic product equipped with the electric connector.

According to the above-mentioned contents with reference to FIGS. 1 to 21, the present invention provides a shielding housing structure of an electric connector, and the shielding housing structure includes an insulating body, a shielding housing and a movable cover; the insulating body has a first terminal slot configured for insertion of a first terminal set, a second terminal slot configured for insertion of a second terminal set, a socket formed between the opposite inner sides of the first terminal set and the second terminal set and configured for insertion of a preset board; the shielding housing has an accommodation space formed therein and configured to assemble with a top side of the insulating body, a horizontal opening and a plurality of top holes and a plurality of lateral holes formed thereon, and an insertion hole formed on upper edges of the plurality of lateral holes; the movable cover includes a top covering plate and a side covering plate perpendicular to each other, and the top covering plate has a plurality of top openings formed thereon, and the side covering plate has a plurality of lateral openings formed thereon, the top covering plate is plugged into the insertion hole of the shielding housing and slidable in the insertion hole in a horizontal direction; when the movable cover is slid to a first position to make the plurality of top openings align and overlap with the plurality of top holes of the shielding housing and make the plurality of lateral openings align and overlap with the plurality of lateral holes of the shielding housing, a plurality of thermal convection ventilation holes can be formed for surface-mount technology process; when the movable cover is slid to a second position to make the plurality of top openings be blocked by the top plate of the shielding housing and make the plurality of lateral openings be blocked by the side plate of the shielding housing, an enclosing status of the shielding housing for shielding electromagnetic wave can be formed. The present invention can be applied to the field of manufacturing M.2 electric connectors, and when the movable cover of the electric connector is located at the first position, the electric connector can be well soldered on the preset circuit board; when the movable cover of the electric connector is located at the second position, the electromagnetic wave, generated by the plurality of conductive terminals of the electric connector during high-speed transmission of electronic data, can be effectively prevented from emitting out of the shielding housing, and it is beneficial to improve production yield rate of the electronic product equipped with the electric connector, and reduce production time and cost of the electronic product equipped with the electric connector.

The present invention disclosed herein has been described by means of specific embodiments. However, numerous modifications, variations and enhancements can be made thereto by those skilled in the art without departing from the spirit and scope of the disclosure set forth in the claims.

What is claimed is:
1. A shielding housing structure of an electric connector, comprising:

an insulating body comprising a first terminal slot configured for insertion of a first terminal set formed by a plurality of first conductive terminals, a second terminal slot configured for insertion of a second terminal set formed by a plurality of second conductive terminals, a socket formed between two opposite inner sides of the first terminal set and the second terminal set and configured for insertion of a preset board;

a shielding housing comprising a top plate, a side plate, and an accommodation space formed therein and configured to assemble with a top side of the insulating body, wherein the accommodation space has a horizontal opening configured to expose the socket, and the top plate of the shielding housing has a plurality of top holes formed thereon, and the side plate of the shielding housing is away from the horizontal opening and has a plurality of lateral holes formed thereon and an insertion hole formed on upper edges of the plurality of lateral holes; and a movable cover comprising a top covering plate and a side covering plate perpendicular to each other, wherein the top covering plate has a plurality of top openings formed thereon, and the side covering plate has a plurality of lateral openings formed thereon, the top covering plate is inserted into the insertion hole of the shielding housing and slidable in the insertion hole in a horizontal direction, wherein when the movable cover is slid to a first position to make the plurality of top openings align and overlap with the plurality of top holes of the shielding housing and make the plurality of lateral openings align and overlap with the plurality of lateral holes of the shielding housing, a plurality of thermal convection ventilation holes are formed for surface-mount technology process, wherein when the movable cover is slid to a second position to make the plurality of top openings be blocked by the top plate of the shielding housing and make the plurality of lateral openings be blocked by the side plate of the shielding housing, an enclosing status of the shielding housing for shielding electromagnetic waves is formed.

2. The shielding housing structure of an electric connector according to claim 1, wherein the insulating body comprises a guide track disposed on a top surface thereof, and the movable cover comprises a sliding slot formed on a side of the plurality of top openings and mounted with the guide track, and a length of the sliding slot is greater than that of the guide track, and the movable cover is slidable on an outer side of the shielding housing in a horizontal direction.

3. The shielding housing structure of an electric connector according to claim 1, wherein the side covering plate of the movable cover has a pushing part disposed on a side thereof and outwardly bent.

4. The shielding housing structure of an electric connector according to claim 1, wherein each of the plurality of first conductive terminals comprises a first joint part upwardly protruded thereon, a first fixing part extended from a side of the first joint part and in a spine shape, and a first solder part downwardly bent from the first fixing part and extended horizontally.

5. The shielding housing structure of an electric connector according to claim 1, wherein each of the plurality of second conductive terminals comprises a second joint part downwardly bent, a second fixing part extended from a side of the second joint part and in a spine shape, and a second solder part downwardly bent from the second fixing part and extended horizontally.

6. The shielding housing structure of an electric connector according to claim 1, wherein the preset board is an M.2 memory card, and the insulating body has an anti-mistaking block disposed correspondingly in position to the socket where the M.2 memory card is plugged.

7. A shielding housing structure of an electric connector, comprising:

an insulating body comprising a first terminal slot configured for insertion of a first terminal set formed by a plurality of first conductive terminals, a second terminal slot configured for insertion of a second terminal set formed by a plurality of second conductive terminals, and a socket formed between the opposite inner sides of the first terminal set and the second terminal set and configured for insertion of a preset board;

a shielding housing comprising a top plate, a side plate, and an accommodation space formed therein and configured to assemble with a top side of the insulating body, wherein the accommodation space has a horizontal opening configured to expose the socket, and the top plate has a plurality of top holes formed thereon, and the side plate is away from the horizontal opening, and has a plurality of lateral holes formed thereon and an insertion hole formed thereon and on upper edges of the plurality of lateral holes; and a movable cover comprising a top covering plate and a side covering plate perpendicular to each other, wherein the top covering plate has a plurality of top openings formed thereon, and the side covering plate has a plurality of lateral openings formed thereon, the top covering plate is configured to tightly plug into the insertion hole of the shielding housing, and is fastened by being half inserted or fully inserted into the insertion hole, wherein when the movable cover is half inserted into the insertion hole to make a part of the plurality of top openings align and overlap with the plurality of top holes of the shielding housing and the remaining of the plurality of top openings are located outside the shielding housing, the plurality of lateral openings are misaligned with the plurality of lateral holes, a plurality of thermal convection ventilation holes are formed for surface-mount technology process, wherein when the movable cover is slid to fully insert into the insertion hole to make the plurality of top openings be blocked by the top plate of the shielding housing and make the plurality of lateral openings be blocked by the side plate of the shielding housing, an enclosing status of the shielding housing for shielding electromagnetic waves is formed.

8. The shielding housing structure of an electric connector according to claim 7, wherein each of the plurality of the first conductive terminals comprises a first joint part upwardly protruded thereon, a first fixing part extended from a side of the first joint part and in a spine shape, and a first solder part downwardly bent from the first fixing part and extended horizontally.

9. The shielding housing structure of an electric connector according to claim 7, wherein each of the plurality of second conductive terminals comprises a second joint part downwardly bent, a second fixing part extended from a side of the second joint part and in a spine shape, and a second solder part downwardly bent from the second fixing part and extended horizontally.

10. The shielding housing structure of an electric connector according to claim 7, wherein the preset board is an M.2 memory card, and the insulating body has an anti-mistaking block disposed correspondingly in position to the socket where the M.2 memory card is plugged.

11. A shielding housing structure of an electric connector, comprising:

an insulating body comprising a first terminal slot configured for insertion of a first terminal set formed by a plurality of first conductive terminals, a second terminal slot configured for insertion of a second terminal set formed by a plurality of second conductive terminals, and a socket formed between the opposite inner sides of the first terminal set and the second terminal set and configured for insertion of a preset board;

a movable cover comprising a top covering plate and a side covering plate perpendicular to each other, and an assembly space clamped between the top covering plate and the side covering plate and configured to assemble with a top side of the insulating body, and a plurality of openings formed on a connection part between the top covering plate and the side covering plate and in communication with the assembly space, wherein the movable cover is slidable on an outer side of the insulating body in a horizontal direction; and a shielding housing comprising a top plate and a side plate perpendicular to each other, and an accommodation space clamped between the top plate and the side plate and configured to assemble with top sides of the insulating body and the movable cover, and a plurality of holes formed on a connection part between the top plate and the side plate and in communication with the accommodation space, wherein the movable cover is slidable between the insulating body and the shielding housing in a horizontal direction, and when the movable cover is slid to a first position to make the plurality of openings align and overlap with the plurality of holes of the shielding housing, a plurality of thermal convection ventilation holes are formed for surface-mount technology process, wherein when the movable cover is slid to a second position to make the top covering plate and the side covering plate block the plurality of holes of the shielding housing, an enclosing status of the shielding housing for shielding electromagnetic waves is formed.

12. The shielding housing structure of an electric connector according to claim 11, wherein the insulating body comprises a guide track disposed on a top surface thereof, and the guide track comprises a plurality of first locating recesses and a plurality of second locating recesses formed on a side thereof, and the movable cover comprises a sliding slot formed on the top covering plate thereof and configured to mount with the guide track, and the sliding slot has a plurality of locating blocks disposed correspondingly in position to the plurality of first locating recesses and the plurality of second locating recesses, and a length of the sliding slot is greater than that of the guide track, so as to make the movable cover slidable under the shielding housing in a horizontal direction.

13. The shielding housing structure of an electric connector according to claim 11, wherein the insulating body comprises a first stop part and a second stop part disposed on two sides of a top surface thereof, the first stop part is configured to abut with and locate a first abutting edge on a side of the top covering plate of the movable cover, and the second stop part is configured to abut with and locate a second abutting edge on another side of the top covering plate of the movable cover.

14. The shielding housing structure of an electric connector according to claim 11, wherein the top covering plate of the movable cover comprises a pushing part protruded on a side thereof, and the pushing part comprises a pushing block protruded on a top thereof, and the shielding housing comprises an operation hole disposed correspondingly in position to the pushing part and the pushing block.

15. The shielding housing structure of an electric connector according to claim 11, wherein each of the plurality of first conductive terminals comprises a first joint part upwardly protruded thereon, a first fixing part extended from a side of the first joint part and in a spine shape, and a first solder part downwardly bent from the first fixing part and extended horizontally.

16. The shielding housing structure of an electric connector according to claim 11, wherein each of the plurality of second conductive terminals comprises a second joint part downwardly bent, a second fixing part extended from a side of the second joint part and in a spine shape, and a second solder part downwardly bent from the second fixing part and extended horizontally.

17. The shielding housing structure of an electric connector according to claim 11, wherein the preset board is an M.2 memory card, and the insulating body has an anti-mistaking block disposed correspondingly in position to the socket where the M.2 memory card is plugged.

* * * * *